(12) United States Patent
Minixhofer et al.

(10) Patent No.: US 9,443,759 B2
(45) Date of Patent: Sep. 13, 2016

(54) METHOD FOR PRODUCING A SEMICONDUCTOR DEVICE COMPRISING A CONDUCTOR LAYER IN THE SEMICONDUCTOR BODY AND SEMICONDUCTOR BODY

(75) Inventors: Rainer Minixhofer, Unterpremstätten (AT); Ewald Stückler, Unterpremstätten (AT); Martin Schrems, Eggersdorf (AT); Günther Koppitsch, Lieboch (AT); Jochen Kraft, Oberaich (AT); Jordi Teva, Eindhoven (NL)

(73) Assignee: AMS AG, Unterpremstaetten (AT)

( * ) Notice: Subject to any disclaimer, the term of this patent is extended or adjusted under 35 U.S.C. 154(b) by 5 days.

(21) Appl. No.: 14/124,666

(22) PCT Filed: May 16, 2012

(86) PCT No.: PCT/EP2012/059159
§ 371 (c)(1),
(2), (4) Date: Mar. 14, 2014

(87) PCT Pub. No.: WO2012/171742
PCT Pub. Date: Dec. 20, 2012

(65) Prior Publication Data
US 2014/0191413 A1    Jul. 10, 2014

(30) Foreign Application Priority Data
Jun. 16, 2011 (DE) .......................... 10 2011 104 305

(51) Int. Cl.
*H01L 21/76*  (2006.01)
*H01L 21/768* (2006.01)
*H01L 23/48*  (2006.01)

(52) U.S. Cl.
CPC ... *H01L 21/76877* (2013.01); *H01L 21/76802* (2013.01); *H01L 21/76898* (2013.01); *H01L 23/481* (2013.01); *H01L 2924/0002* (2013.01)

(58) Field of Classification Search
None
See application file for complete search history.

(56) References Cited

U.S. PATENT DOCUMENTS

| 3,323,198 | A  | * | 6/1967 | Shortes ............... 438/603 |
| 5,424,245 | A  | * | 6/1995 | Gurtler et al. ........... 438/107 |
| 6,122,187 | A  |   | 9/2000 | Ahn et al. |
| 6,184,584 | B1 | * | 2/2001 | Sakao ............... 257/758 |
| 6,583,030 | B1 | * | 6/2003 | Grassl .............. 438/459 |

(Continued)

FOREIGN PATENT DOCUMENTS

JP    11195706 A    7/1999

OTHER PUBLICATIONS

Lindfors, "Boron Solubility Limits Following Low Temperature Solid Phase Epitaxial Regrowth" Materials Research Society, 2001, pp. J8.5.1-J8.5.6, vol. 669.

(Continued)

*Primary Examiner* — Scott B Geyer
(74) *Attorney, Agent, or Firm* — McDermott Will & Emery LLP

(57) ABSTRACT

A cutout (11), which penetrates the semiconductor body, is present in the semiconductor body (1). A conductor layer (6), which is electrically conductively connected to a metal plane (3) on or over the semiconductor body, screens the semiconductor body electrically from the cutout. The conductor layer can be metal, optionally with a barrier layer (6a), or a doped region of the semiconductor body.

11 Claims, 25 Drawing Sheets

(56) References Cited

U.S. PATENT DOCUMENTS

| | | | |
|---|---|---|---|
| 8,629,059 B2* | 1/2014 | Lee et al. | 438/667 |
| 2002/0115260 A1 | 8/2002 | Halahan et al. | |
| 2007/0166997 A1* | 7/2007 | Knorr | 438/622 |
| 2007/0194431 A1 | 8/2007 | Corisis et al. | |
| 2007/0290300 A1 | 12/2007 | Kawakami | |
| 2009/0134497 A1* | 5/2009 | Barth et al. | 257/621 |
| 2009/0236691 A1* | 9/2009 | Dyer et al. | 257/532 |
| 2010/0123254 A1* | 5/2010 | Kraft | H01L 21/76898 257/773 |
| 2010/0127345 A1 | 5/2010 | Sanders et al. | |
| 2010/0127346 A1 | 5/2010 | DeNatale et al. | |
| 2010/0178747 A1* | 7/2010 | Ellul et al. | 438/386 |
| 2010/0314758 A1 | 12/2010 | Wu et al. | |
| 2011/0260284 A1* | 10/2011 | Schrank et al. | 257/506 |

OTHER PUBLICATIONS

Saubbi, "Chemical Vapor Deposition of α-Boron Layers on Silicon for Controlled Nanometer-Deep p+n. Junction Formation" Electronic Materials, 2010 pp. 162-173, vol. 39, No. 2.

* cited by examiner

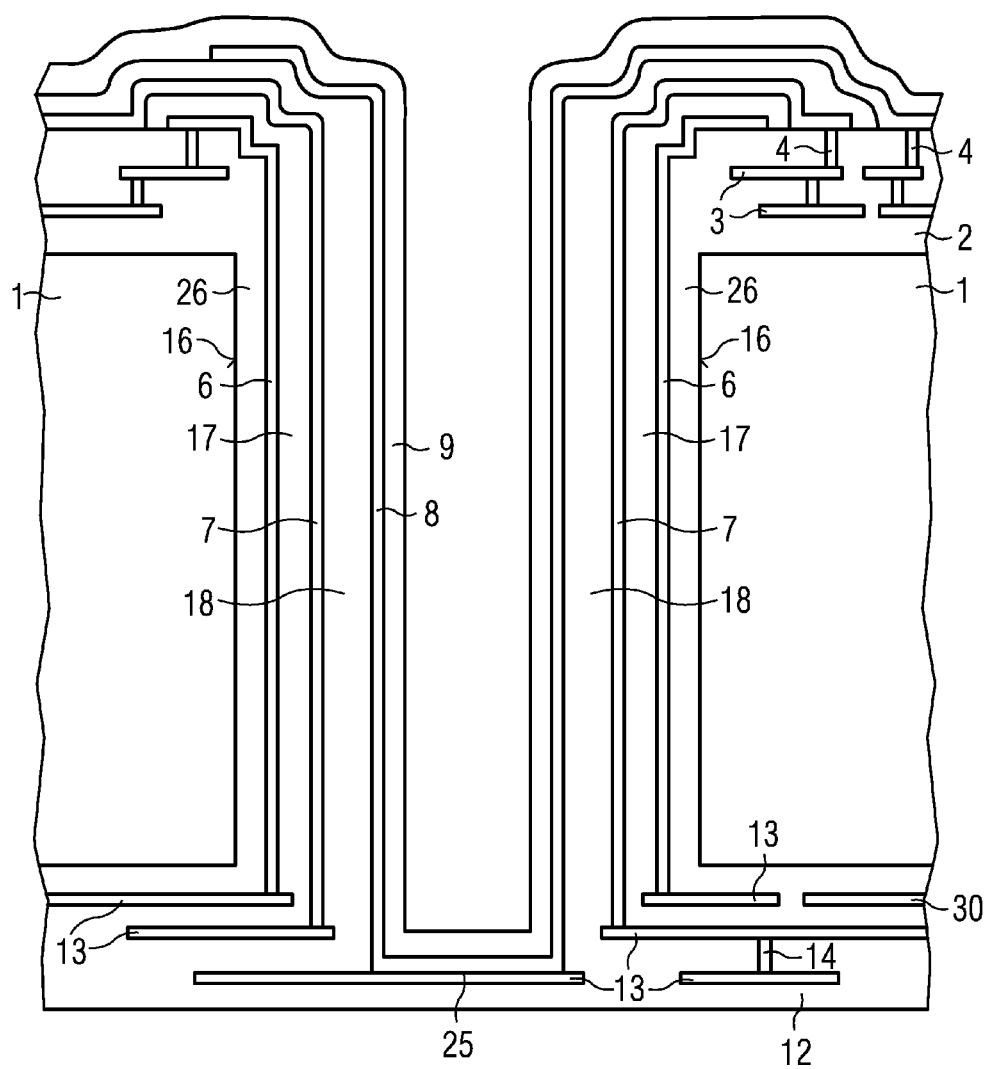

METHOD FOR PRODUCING A SEMICONDUCTOR DEVICE COMPRISING A CONDUCTOR LAYER IN THE SEMICONDUCTOR BODY AND SEMICONDUCTOR BODY

The invention under consideration concerns a semiconductor device with a conductor structure in the semiconductor body, in particular as a vertical inner screen in the substrate, as a coaxially screened through-connection, and/or as a capacitor.

Through-connections in semiconductor substrates are used in 3D integration, in order to keep the volume of the component as small as possible, to improve the operating characteristics, and to make possible a low-cost production. If high frequency signals are conducted via through-connections, coupling effects in the substrate lead to disturbances.

A low electrical conductivity of the substrate as a result of a low doping is desired to avoid crosstalk between circuit blocks and to block high electrical field strengths. One disadvantage hereby is that the charge carriers injected in the substrate produce high voltage drops and, thus, scattering potentials within the semiconductor body as a result of the high electrical resistance. In particular in high-volt and power circuits, that can lead to faulty operations up to the destruction of the circuit. Furthermore, with circuits in low-doped substrates, there is an increased danger of a so-called latch-up.

In order to eliminate scattering potentials, the backside of the semiconductor substrate can be provided with a whole-surface contact. The desired effect, however, begins only if the substrate is doped sufficiently high. For the electronic circuit, then, a lower-doped semiconductor layer is usually provided on the upper side of the substrate. Such a layer can, for example, be produced by epitaxial growth in a monocrystalline manner on the substrate. The backside contact can, for example, be mounted with a lead-frame and grounded in this manner, so that scattering potentials are short-circuited to ground.

A screening of electrical fields with high frequency cables is known from coaxial cables. The publication by Ivan Ndip, "High-Frequency Modeling of TSVs for 3D Chip Integration and Silicon Interposers Considering Skin-Effect, Dielectric Quasi-TEM and Slow-Wave Modes", IEEE Transactions on Advanced Packaging 2010, contains a theoretical proposal for coaxial cables in semiconductor devices.

In US 2007/0290300 A1, a semiconductor device with through-connections is described. The through-connections have two electrically conductive layers insulated from one another and from the semiconductor material of the substrate. For the production, an opening is etched into a silicon substrate. Then, insulating and conductive layers are placed on the inside wall of the opening and on the front side and backside of the substrate.

In the publication by C. D. Lindfors, K. S. Jones, and M. J. Rendon, "Boron Solubility Limits Following Low Temperature Solid Phase Epitaxial Regrowth," Mat. Res. Soc. Symp. Proc., Volume 669, J8.5.1-J8.5.6, an epitaxial process is described, with which amorphous areas in semiconductor material are recrystallized after an implantation.

In the publication by F. Sarubbi, T. L. M. Scholtes, and L. K. Nanver, "Chemical Vapor Deposition of α-Boron Layers on Silicon for Controlled Nanometer-Deep p+n Junction Formation," J. Elec. Mat., Volume 39, pages 162-173 (2010), the production of a doped semiconductor layer is described by means of an atomic layer deposition or a low temperature chemical vapor deposition.

The object of the invention under consideration is to indicate new possibilities for the implementation of a vertical conductor structure in the semiconductor body of a semiconductor device.

This object is achieved with the methods for producing a semiconductor device and with the semiconductor device as claimed and described herein. Embodiments and variants can be derived from the pertinent dependent claims.

The semiconductor device has a semiconductor body with a cutout that completely penetrates through the semiconductor body. The cutout is electrically screened by an electrically conductive conductor layer from the semiconductor material. The conductor layer can, in particular, form a structure of a coaxial cable together with a through-connection located in the cutout. This structure can be formed by coaxially arranged cylindrical tubes made of metal. The outer conductor layer of the through-connection can, in particular, be formed by a doped section in the semiconductor material. Aside from the possibility of forming a through-connection, the structure of the coaxial conductor is also suitable for forming a capacitor with a comparatively high capacitance.

In the method for producing a semiconductor device, a semiconductor body is provided on at least one upper side or underside with metal planes in a dielectric. A cutout is produced in the dielectric and in the semiconductor body, so that the cutout penetrates through the semiconductor body and the semiconductor body has a surface in the cutout. A conductor layer is produced on this surface in direct connection with the semiconductor body, and the conductor layer is electrically conductively connected to one of the metal planes.

In an embodiment of the method, the conductor layer is produced by implanting a doping substance in the semiconductor body.

In a further embodiment of the method, the conductor layer is produced by applying a barrier layer on the surface of the semiconductor body and applying a metal on the barrier layer. The barrier layer can, for example, contain titanium. The metal can be tungsten, for example.

In a further embodiment of the method, the semiconductor body is silicon, and a silicide is formed with the conductor layer. For the purpose, for example, a TiN layer or a Ti/TiN layer can be provided, with which titanium silicide is formed on the surface of the semiconductor body. A TiN layer can also be provided as a barrier layer. The metal can also be, in particular, tungsten in this embodiment.

In a further embodiment of the method, the conductor layer in the cutout can be covered with a spacer of a dielectric material. A metal layer is applied and structured, so that the metal layer is present within the cutout and is insulated from the conductor layer by the spacer, and outside the cutout, is electrically conductively connected to at least one of the metal planes.

In a further method for producing a semiconductor device, a semiconductor body is provided on an upper side and on an underside opposite the upper side with a dielectric and with metal planes arranged at least on one side of the semiconductor body in the dielectric. A cutout is produced in the dielectric present on the upper side and in the semiconductor body, so that the cutout penetrates through the semiconductor body and is limited by the dielectric present on the underside. A conductor layer is placed and structured in such a way that it screens the semiconductor body toward the cutout and is electrically conductively connected to at least one of the metal planes. The conductor layer is covered in the cutout with a spacer made of dielectric material. A metal layer is placed and structured so that the metal layer is present within the cutout and is insulated electrically from the conductor layer by the spacer and is electrically conductively connected to at least one of the metal planes outside the cutout.

In a further embodiment of the method, at least one of the metal planes is provided in the dielectric located on the underside of the semiconductor body, and with the production of the spacer, a section of this metal plane is exposed. The metal layer is placed and structured in such a way that the metal layer forms a connection contact on the exposed section.

In further embodiments of the method, one of the metal planes in the area of the cutout is removed after the production of the cutout and before the production of the conductor layer. The conductor layer is placed in such a manner that it forms a contact on this metal plane, which is vertical relative to this metal plane.

In further embodiments of the method, the metal layer in the cutout is covered with another spacer made of dielectric material. Another metal layer is placed and structured, so that the other metal layer is present within the cutout and is electrically insulated from the metal layer by the other spacer and is electrically conductively connected to at least one of the metal planes outside the cutout.

In further embodiments of the method, the conductor layer, the metal layer, and the other metal layer are contacted on both sides of the semiconductor body by different metal planes.

In further embodiments of the method, the conductor layer, the metal layer and the other metal layer are contacted at least on one side of the semiconductor body by the same metal plane.

In the semiconductor device a semiconductor body is present, on or above which at least one metal plane is located. A cutout completely penetrates through the semiconductor body between an upper side and an underside opposite the upper side, so that the semiconductor body has a surface that is formed by the cutout. A conductor layer electrically screens the semiconductor body from the cutout and is electrically conductively connected to one of the metal planes. A metal layer is located in the cutout and is insulated electrically from the conductor layer by a spacer made of dielectric material. The conductor layer is located directly on the surface of the semiconductor body formed by the cutout.

In an embodiment of the semiconductor device, the conductor layer is made as a doped section of the semiconductor body.

In a further embodiment of the semiconductor device, the semiconductor body is silicon, and the conductor layer comprises a barrier layer located on the semiconductor body, and a metal. The barrier layer can be TiN, in particular.

In a further embodiment of the semiconductor device, the conductor layer and the metal layer form a through-connection.

In a further embodiment of the semiconductor device, the conductor layer and the metal layer form a capacitor In a further embodiment of the semiconductor device, the conductor layer is electrically conductively connected to one of the metal planes only on one side of the semiconductor body.

A more detailed description of examples of the semiconductor device and the production method follows, with the aid of the appended figures.

FIG. 27 shows a cross-section in accordance with FIG. 22 for another embodiment with three metal layers.

Figure 1:
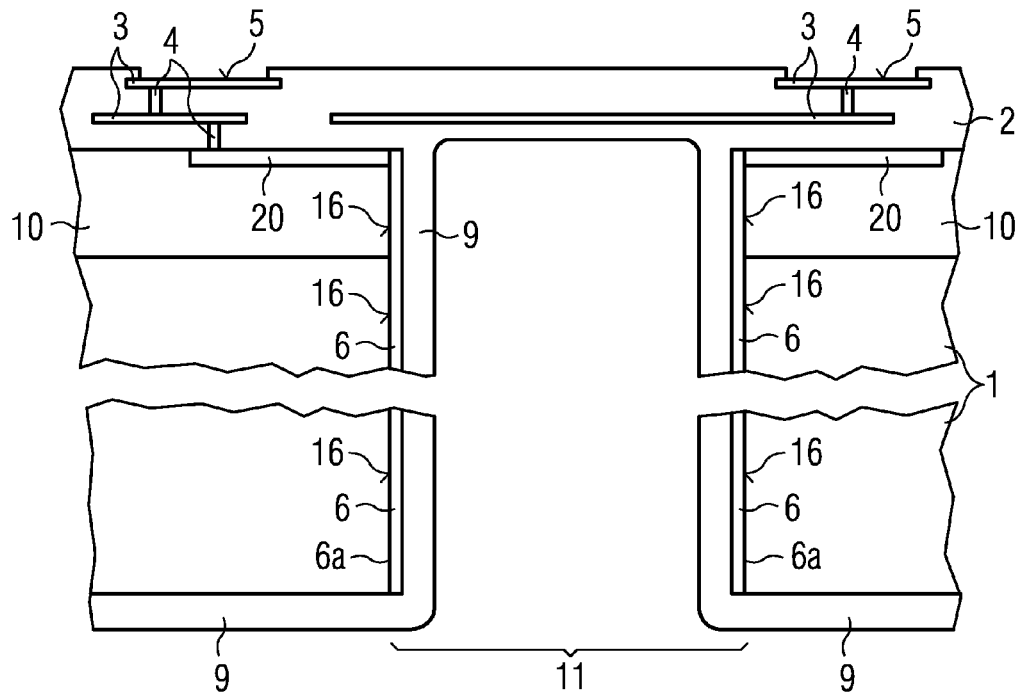
FIG. 1 shows a cross-section through a semiconductor device with a screening conductor layer in the substrate.

FIG. 1 shows a cross-section through an embodiment of the semiconductor device. In this example the semiconductor body 1, which can be silicon, for example, is highly doped and provided with a low-doped epitaxial layer 10. In other embodiments the epitaxial layer 10 can be omitted. A cutout 11 penetrates completely through the semiconductor body 1. The cutout 11 can have a cylindrical shape, for example. Several such cutouts 11 can be provided in the semiconductor body 1 as openings, for though-connections for example. The cutout 11 is electrically screened from the semiconductor body 1 by a conductor layer 6. The conductor layer 6 is located at a surface 16 of the semiconductor body 1 which is present in the cutout 11, and there forms a side wall of the semiconductor body 1. The conductor layer 6 is, in particular, advantageous when using a highly doped semiconductor body 1 for high electrical conductivity.

The conductor layer 6 can be formed as a doped region in the semiconductor material, for example. Such a doped region can, for example, be produced by a side wall implantation of dopant, for example by means of $BF_2$. The semiconductor material which became amorphous due to the implantation can subsequently be brought to a crystalline form by epitaxy and a healing process at low temperature. A suitable method for this can be deduced from the publication by C. D. Lindfors et al., cited previously.

The conductor layer 6 can, instead, be produced as a thin doped layer by means of an atomic layer deposition or a low temperature vapor deposition. A suitable method for this can be deduced from the publication by F. Sarubbi et al., cited previously.

Instead, it is also possible to produce the conductor layer 6 as a metal layer on the upper side 16 in the cutout 11. A metal layer provided for the conductor layer 6 can optionally be electrically insulated from the semiconductor material of the semiconductor body 1.

If the semiconductor body 1 is silicon and the conductor layer 6 is metal, the conductor layer 6 should not be applied directly on the silicon, since otherwise uncontrolled reactions between the metal and the silicon can appear. In order to avoid that, the conductor layer 6 can be provided with a thin barrier layer 6a, for example, a thin titanium nitride layer, which separates the metal from the semiconductor body 1. The barrier layer 6a can be, in particular, made in such a way that it forms a silicide with the silicon. To this end, in particular, titanium silicide, with which a better electrical contacting and a better adhesion of the conductor layer 6 on the semiconductor body 1 are achieved, is suitable. On the barrier layer 6a, for example, tungsten can be applied. Since the barrier layer 6a is thin, almost the entire thickness of the conductor layer 6 is taken up by the metal applied thereon—that is, for example, by tungsten.

On or above an upper side of the semiconductor layer 1, in particular on or above the epitaxial layer 10, there is a dielectric 2 with at least one structured metal plane 3 located therein. Several structured metal planes 3 can be arranged above one another in the dielectric 2 and can be provided by wirings with vertical connections 4 in a manner known per se. Connection contact surfaces 5, which are not covered with the dielectric 2, can be provided on the uppermost metal plane 3. The connection contact surfaces 5 can be electrically conductively connected to connection contact surfaces of another semiconductor device, in particular, in a stack of chips in which the semiconductor devices are used for three-dimensional integration.

In the embodiment of FIG. 1, the conductor layer 6 is electrically conductively connected to at least one of the metal planes 3 above a doped region 20, which is formed in the epitaxial layer 10. The conductor layer 6 can be brought to a defined electrical potential via this electrical connection, which is advantageous for electrical screening. To this end, it is sufficient if the conductor layer 6 is connected only on one side of the semiconductor body 1 to a metal plane 3, on which the intended electrical potential is applied by means of a switch.

In case of a cylindrical cutout 11, the conductor layer 6 can form a cylindrical jacket, and the doped region 20 can surround the cutout 11 as a circular ring. The conductor layer 6 and the back surface of the semiconductor body 1 can be covered with a passivation layer 9.

Since the form of the cutout 11 can be modified in diverse ways, different regions of the semiconductor body 1 can be electrically screened relative to other regions of the semiconductor body 1 with the described conductor layer 6. Furthermore, this arrangement can be used for the formation of through-connections. That is explained in more detail, below, with the aid of FIGS. 2 to 4.

Figure 2:
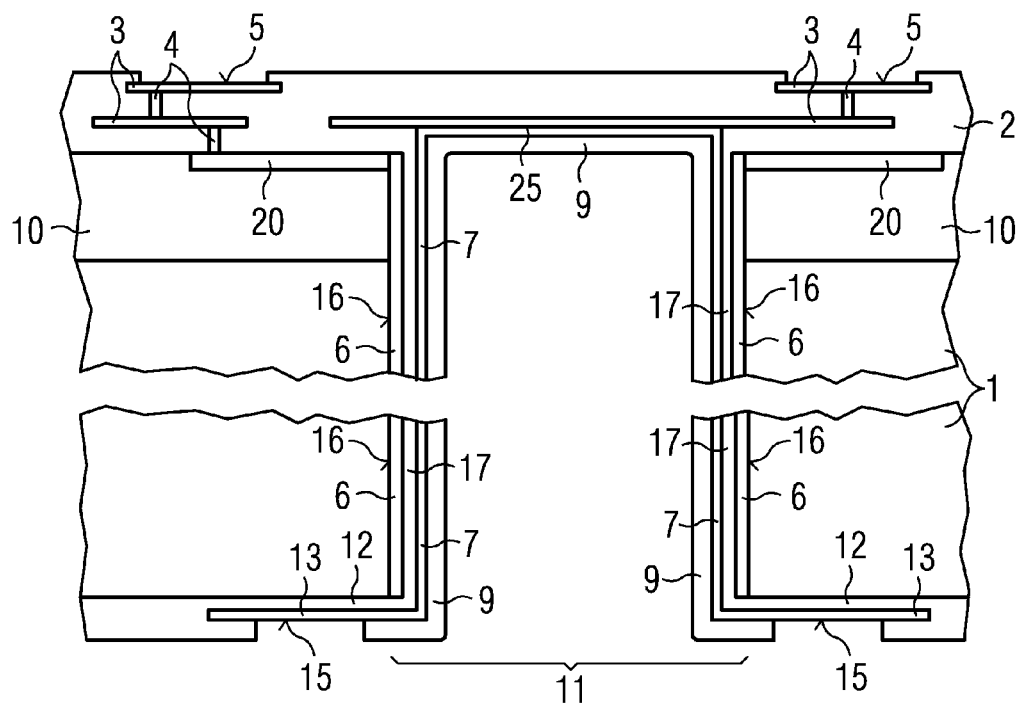
FIG. 2 shows a cross-section in accordance with FIG. 1 for an embodiment with a through-connection.

FIG. 2 shows a cross-section through a further embodiment of the semiconductor device, in which in addition to the conductor layer 6, a metal layer 7 is arranged in the cutout 11 of the semiconductor body 1. The other elements of this embodiment correspond to the embodiment according to FIG. 1 and are therefore provided with the same reference numerals. The conductor layer 6 and the metal layer 7 are electrically insulated from one another by a spacer 17. The spacer 17 can be made of the same material as the dielectric 2, that is, in particular, an oxide of silicon.

The metal layer 7 is provided as a through-connection in the embodiment of FIG. 2 and forms a connection contact 25 on one of the metal planes 3. On the opposite side of the semiconductor body 1, the metal layer 7 is connected to a metal plane 13 that is present there, which is also embedded in a dielectric 12. The passivation layer 9 that covers the metal layer 7 can be omitted in areas, so that at least one connection contact surface 15 for an external electrical connection is formed on the metal plane 13. In particular, the conductor layer 6 and the metal layer 7 can be cylindrical and arranged coaxial to one another. The cutout 11 can be filled with a dielectric material, for example, or can instead remain open.

The metal layer 7 can be provided as a through-connection or instead, together with the conductor layer 6, as a capacitor. The capacitor dielectric in this case is formed by the spacer 17. Also in the embodiment of FIG. 2, the conductor layer 6 can be formed by an implantation in the semiconductor body or by an applied metal, preferably on a barrier layer, which forms a silicide, as described above in connection with the embodiment according to FIG. 1.

Figure 3:
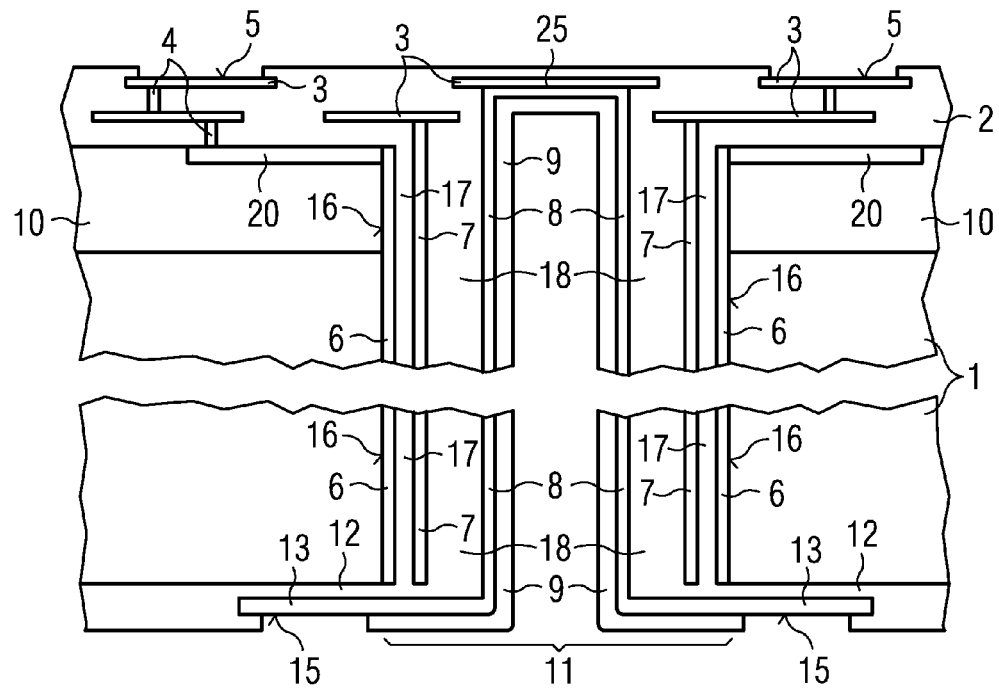
FIG. 3 shows a cross-section in accordance with FIG. 2 for an embodiment with a screening metal layer.

FIG. 3 shows an embodiment in which a further metal layer 8 is provided for the formation of the through-connection. Between the metal layer 7 and the further metal layer 8, there is a further spacer 18, which is also a dielectric material. In the embodiment shown in FIG. 3, the metal layer 7 is electrically conductively connected to one of the metal planes 3. The electrical potentials of the conductor layer 6 and the metal layer 7, therefore, always agree with the electrical potentials of the metal planes 3 connected to them. The metal layer 7 can be kept at a floating potential, or a defined electrical potential can be applied on the metal layer 7. The shielding between the actual through-connection, which is formed by the further metal layer 8, and the semiconductor body 1 is improved in comparison with the embodiment of FIG. 2. The metal layer 7 and the further metal layer 8 can in each case be connected to portions of the same metal plane 3, or, instead, to different metal planes, as shown in FIG. 3.

Figure 4:
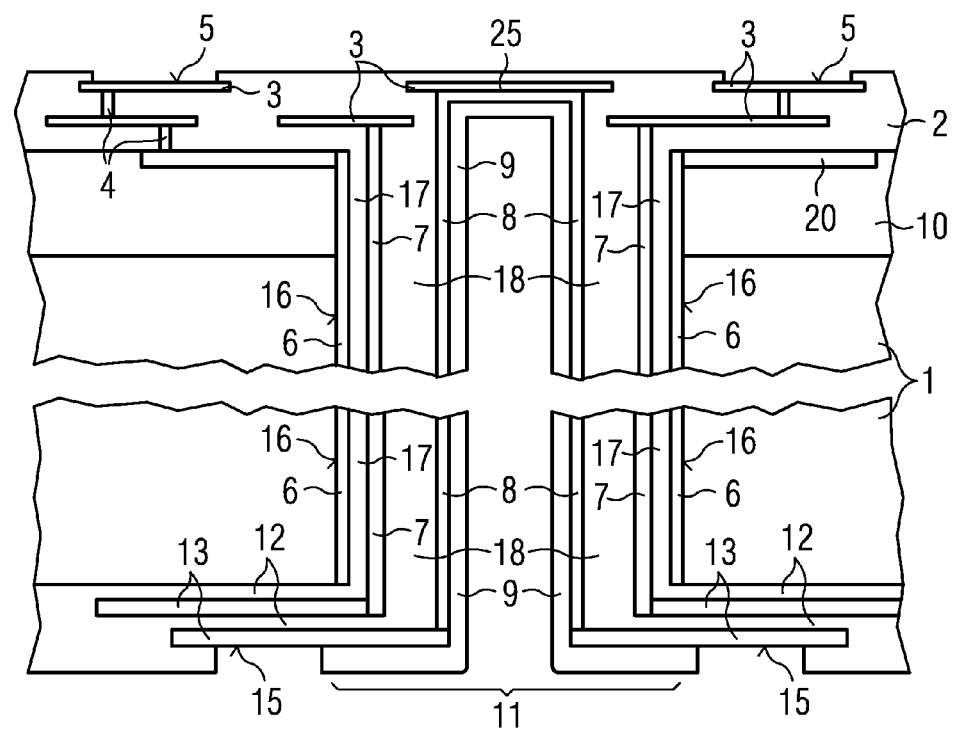
FIG. 4 shows a cross-section in accordance with FIG. 3 for an embodiment in which the metal layers are connected to metal planes on both sides.

FIG. 4 shows a cross-section of an embodiment in which the metal 7 is connected to a back metal plane 13. In this embodiment, the screening achieved by the metal layer 7 is also effective between the doped region 20 and the upper-side metal planes 3 and between the semiconductor body 1 and the back metal planes 13. The metal layer 7 can be kept at a floating potential, or a defined electrical potential can be applied on the metal layer 7. The metal layer 7 can, for example, also be connected to one of the external connection contact surfaces 5 as is shown in FIG. 4 on the right side. Instead of a screen, the further metal layer 8 can be used as a through-connection. Thus, there is the possibility of using the same cutout 11 for more than one through-connection.

Figure 5:
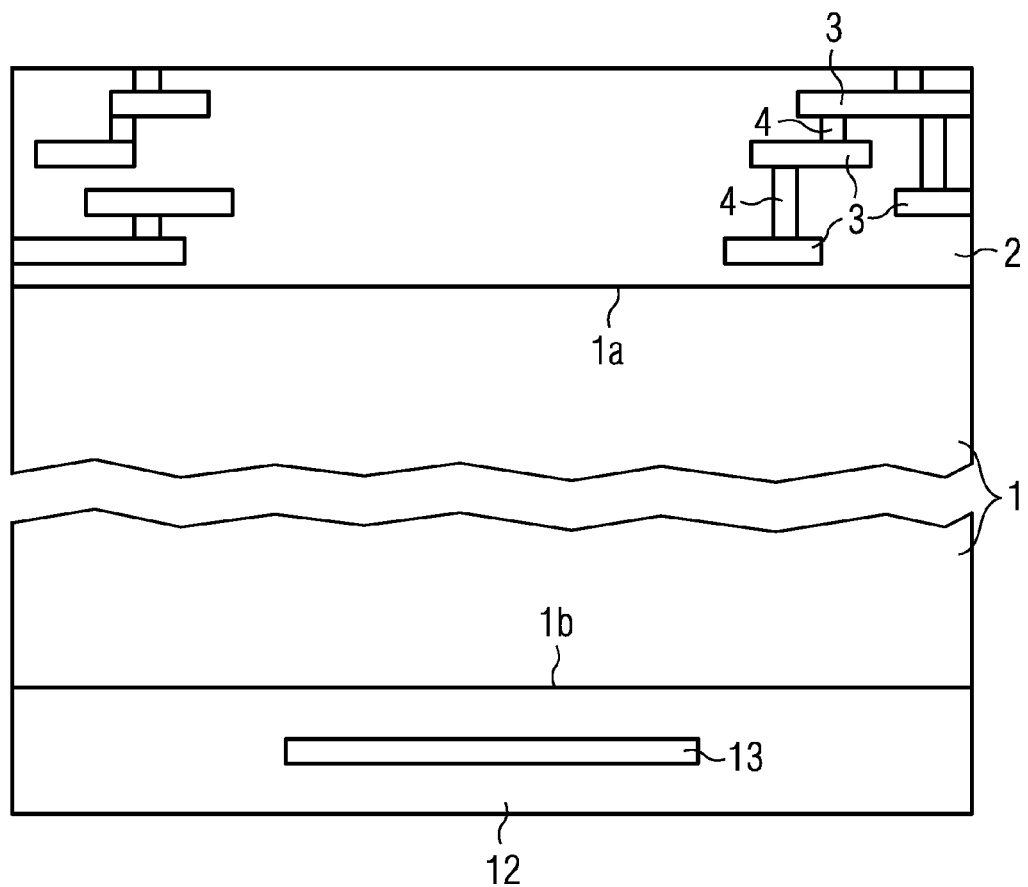
FIG. 5 shows a cross-section through a first intermediate product of a production method.

For the production of the semiconductor component, a semiconductor body 1 with dielectrics 2, 12 applied on an upper side 1a and on an underside 1b is first made available in accordance with the cross-section of FIG. 5. Metal planes 3 are located at least in the dielectric 2 provided on the upper side 1a. Metal planes 3, 13 are located in the dielectrics 2, 12 both on the upper side 1a as well as on the underside 1b in the embodiment shown in FIG. 5. The metal planes 3, 13 can be connected to one another on both sides or at least on one side via vertical connections 4 as wiring.

Figure 6:
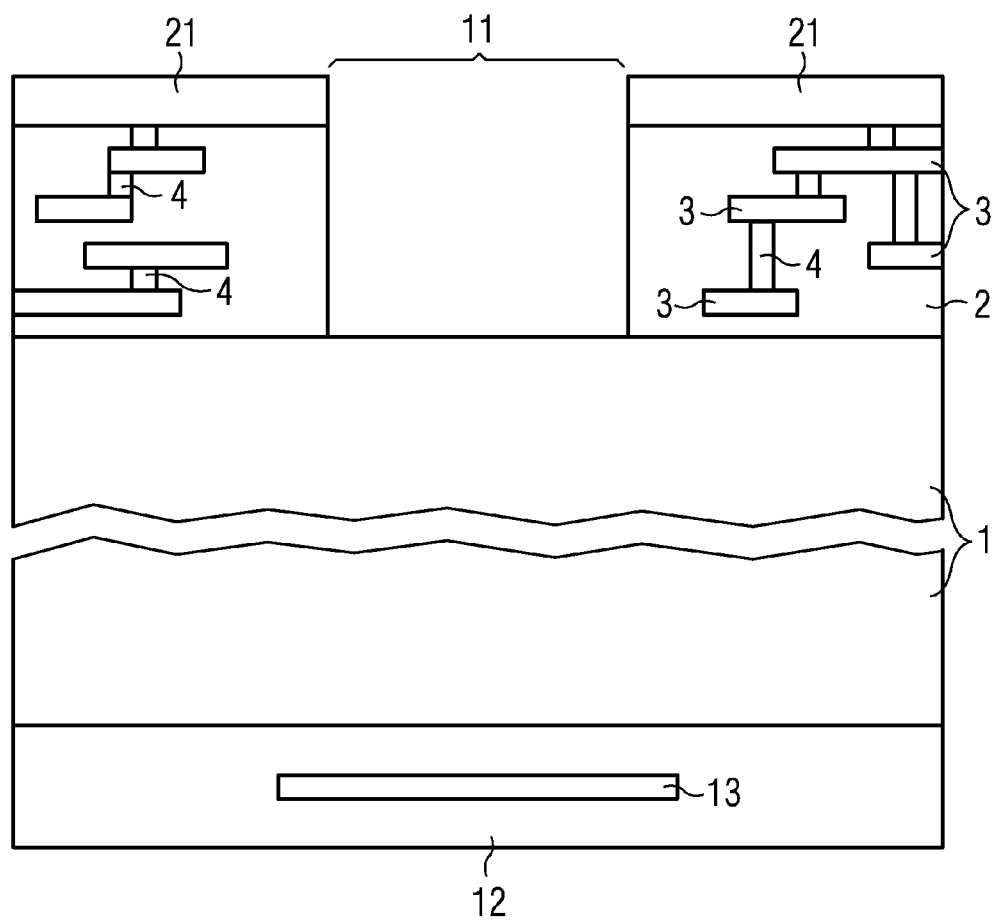
FIG. 6 shows a cross-section in accordance with FIG. 5 after the production of a cutout in the dielectric.

FIG. 6 shows another intermediate product of the production method in a cross-section in accordance with the cross-section of FIG. 5 after a mask 21 was applied and used for the production of the cutout 11 in the upper-side dielectric 2. The dielectric 2 can be removed by etching, for example, and this step ends on the semiconductor material of the semiconductor body 1.

Figure 7:
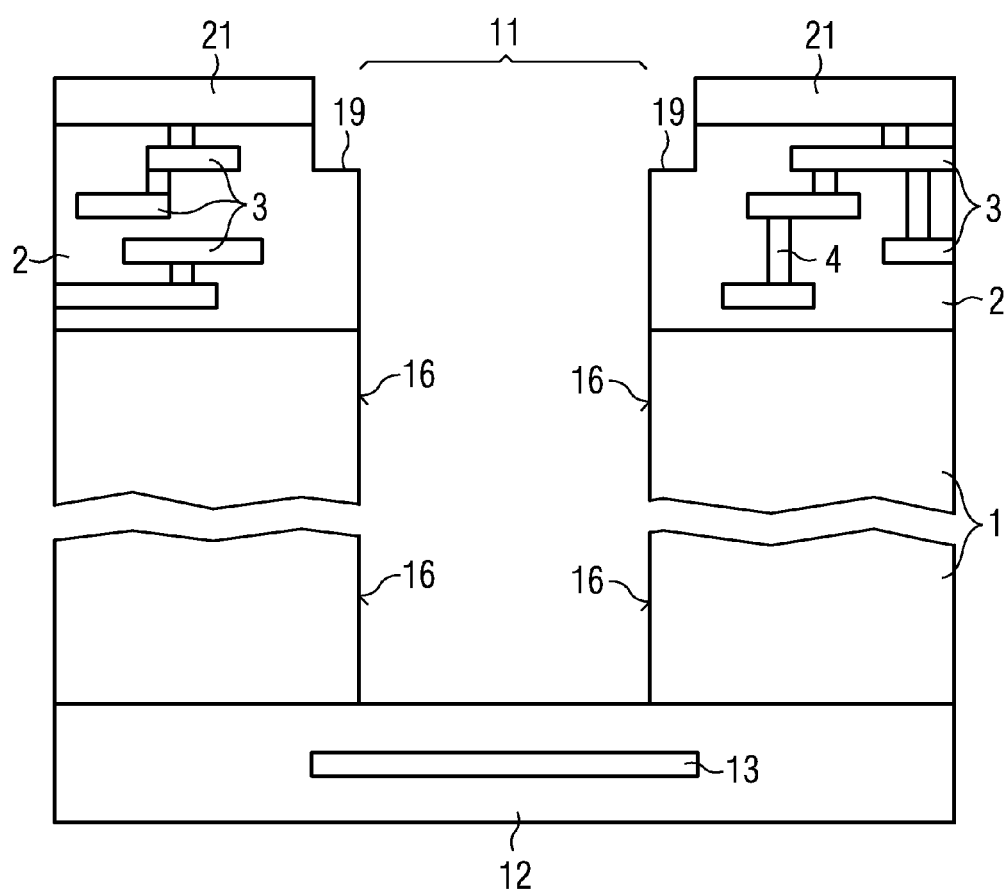
FIG. 7 shows a cross-section in accordance with FIG. 6 after the production of a cutout in the substrate.

FIG. 7 shows a cross-section in accordance with FIG. 6 after the etching of the cutout 11 was continued into the semiconductor material of the semiconductor body 1 until the back dielectric 12 was reached. In this etching operation, the opening of the mask 21 was widened somewhat, so that a step 19 is eventually formed in the upper-side dielectric 2.

Figure 8:
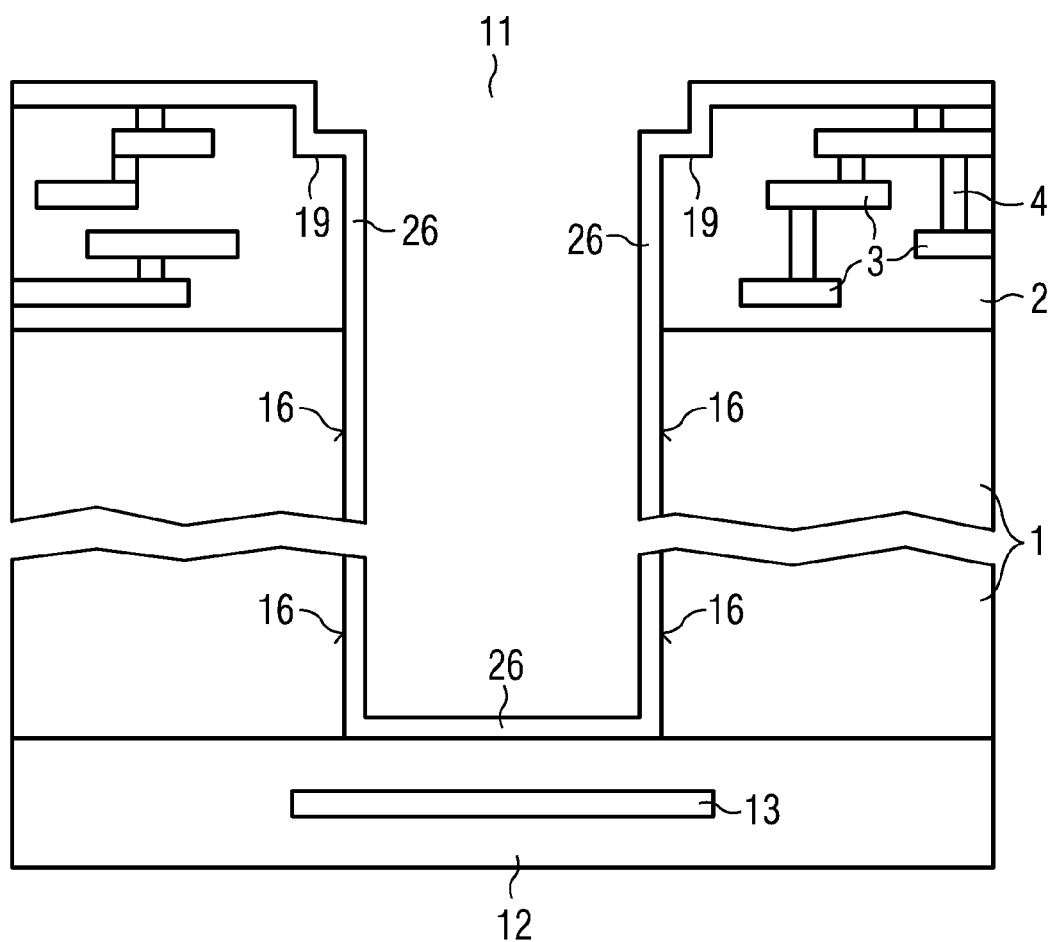
FIG. 8 shows a cross-section in accordance with FIG. 7 after the application of a spacer layer.

FIG. 8 shows a cross-section in accordance with FIG. 7 after the removal of the mask 21 and the whole-surface application of an insulation layer 26, which can also be omitted, however. The insulation layer 26 can be an oxide of the semiconductor material, for example, in particular $SiO_2$.

Figure 9:
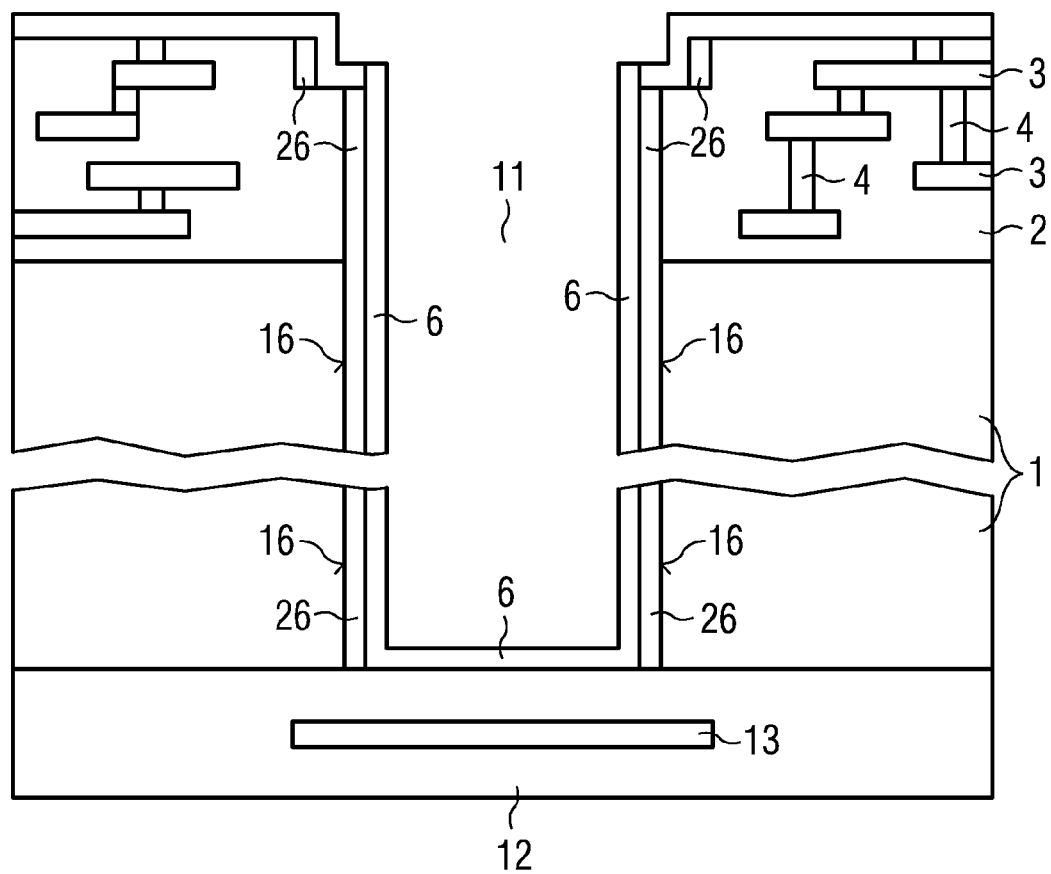
FIG. 9 shows a cross-section in accordance with FIG. 8 after the production of a spacer and a metal layer.

FIG. 9 shows a cross-section in accordance with FIG. 8 after a back etching of the insulation layer 26 and the application of the conductor layer 6, which can be a metal, for example. If the insulation layer 26 is omitted, the conductor layer 6 is instead applied directly on the surface 16 of the semiconductor body. Remaining portions of the insulation layer 26 are found after an anisotropic back etching of the insulation layer 26 on the surface of the dielectric 2 and on the surface 16 of the semiconductor body 1 in the cutout 11.

Figure 10:
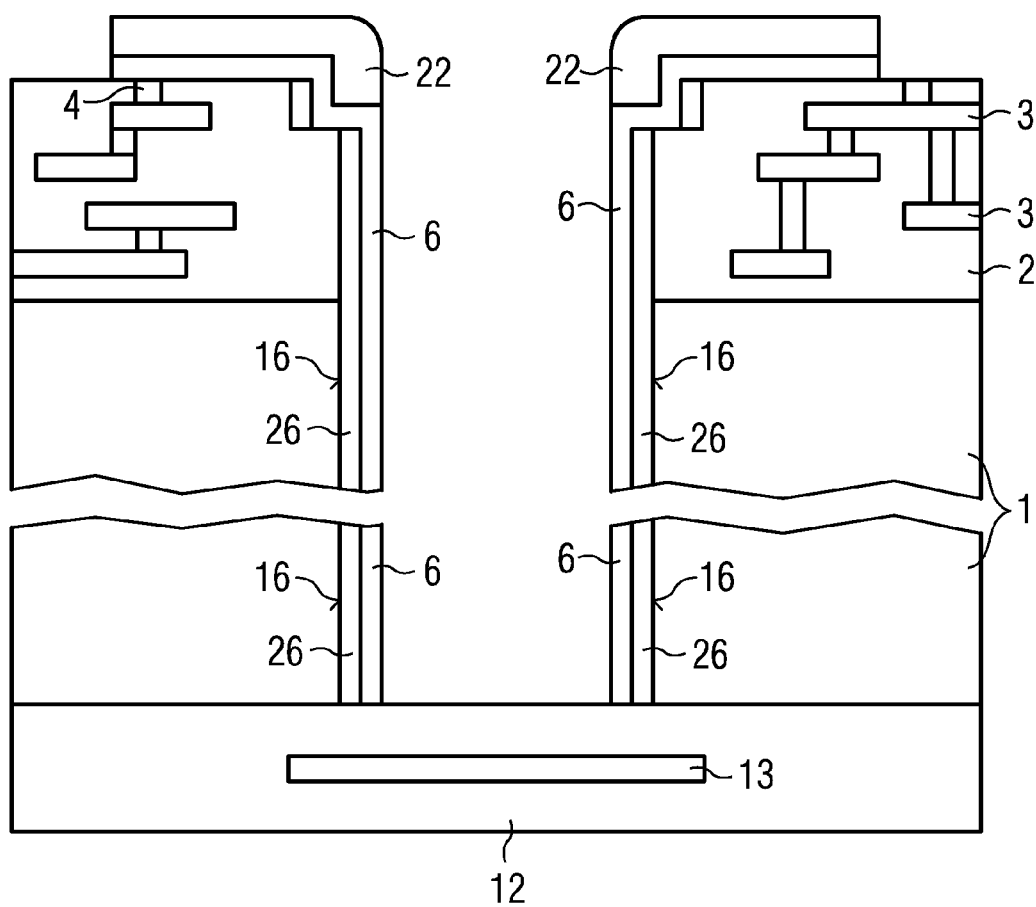
FIG. 10 shows a cross-section in accordance with FIG. 9 after the structuring of the metal layer.

FIG. 10 shows a cross-section in accordance with FIG. 9 after the application of a further mask 22, by means of which the conductor layer 6, which is first applied on the whole surface, is structured. In this step, the material of the conductor layer 6 is removed from the bottom of the cutout 11, so that the back dielectric 12 is exposed there. Furthermore, the conductor layer 6 can be structured at one or more portions on the upper side; they are used, for example, for electrical connection to the metal planes 3. The conductor layer 6 can be electrically conductively connected to an upper-side metal plane 3, in particular via a vertical connection 4.

Figure 11:
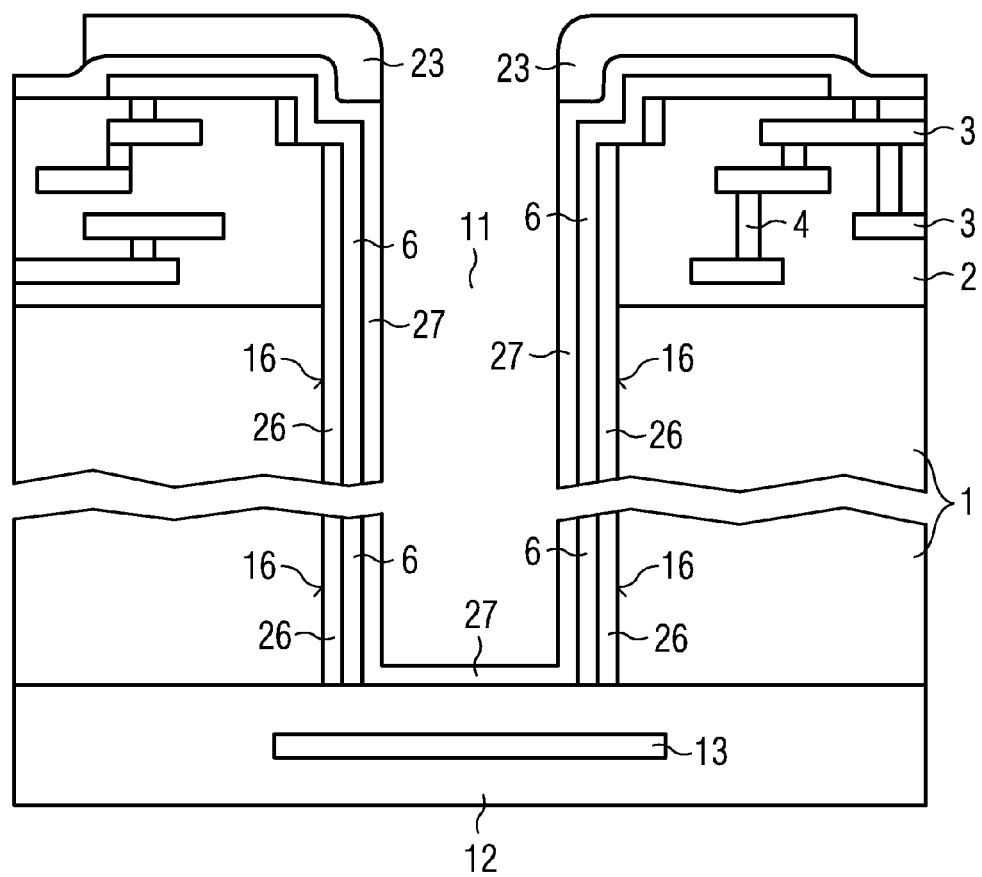
FIG. 11 shows a cross-section in accordance with FIG. 10 after the application of another spacer layer.

FIG. 11 shows a cross-section in accordance with FIG. 10 after the application of a spacer layer 27 and another mask 23, which is used for the structuring of the spacer layer 27.

Figure 12:
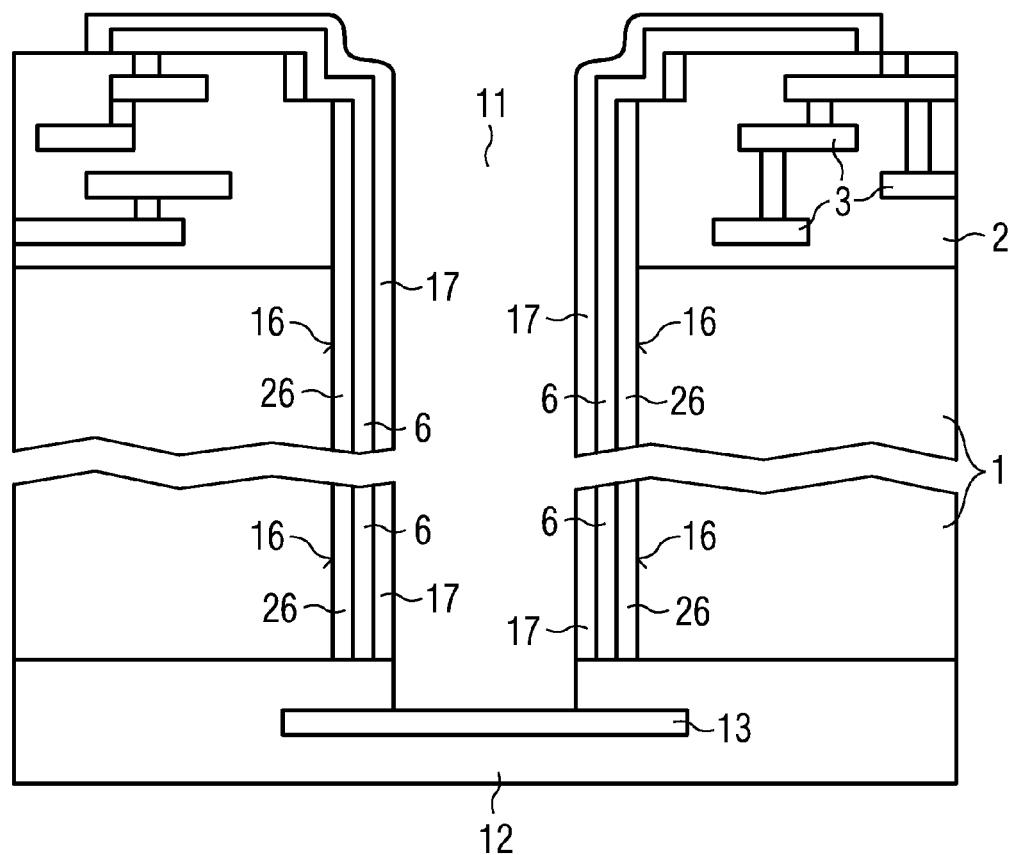
FIG. 12 shows a cross-section in accordance with FIG. 11 after the production of another spacer.

FIG. 12 shows a cross-section in accordance with FIG. 11 after the anisotropic back etching of the spacer layer 27, so that a spacer 17 remains on the conductor layer 6. This spacer 17 can also be provided for the purpose of electrically insulating the conductor layer 6 also on the upper side of the device. Together with the spacer layer 27, the back dielectric 12 is preferably removed from the bottom of the cutout 11 down to a back metal plane 13, so that a connection contact surface of the back metal plane 13 is exposed there.

Figure 13:
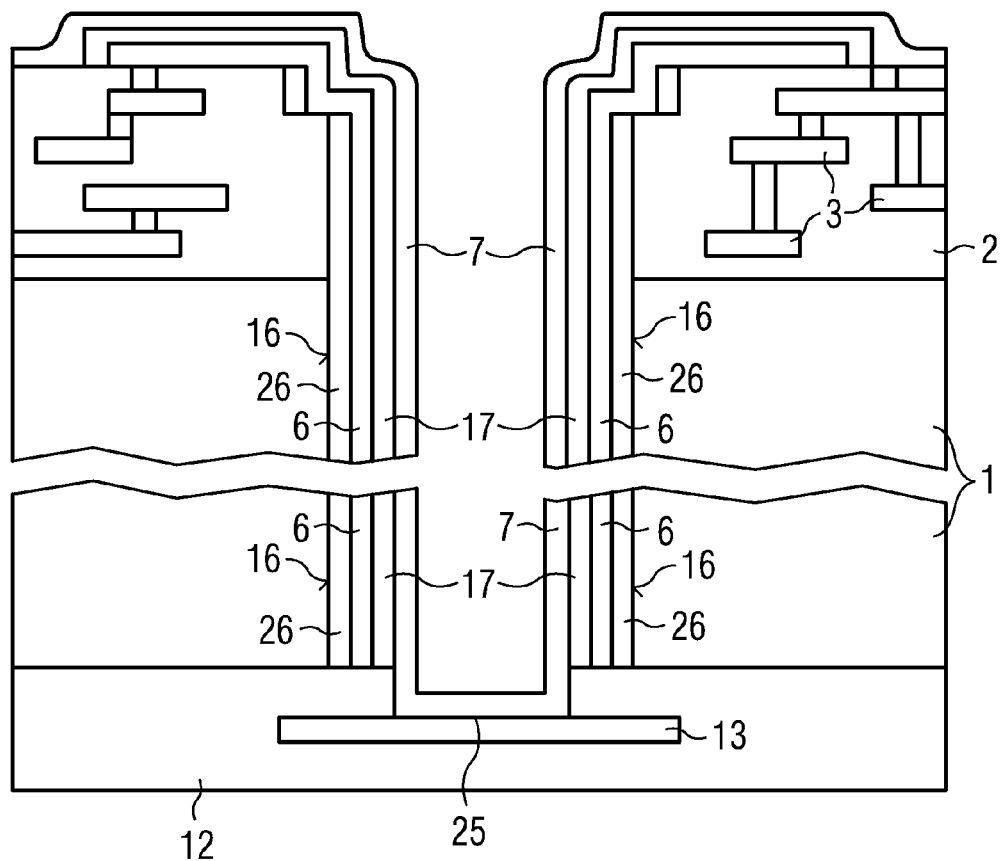
FIG. 13 shows a cross-section in accordance with FIG. 12 after the application of another metal layer.

FIG. 13 shows a cross-section in accordance with FIG. 12 after the whole-surface application of a metal layer 7 with which a connection contact 25 is formed on the back metal plane 13. The metal layer 7 is electrically insulated from the conductor layer 6 by the spacer 17. The metal layer 7 can be electrically conductively connected to an upper-side metal plane 3, like the conductor layer 6, via a vertical connection 4.

Figure 14:
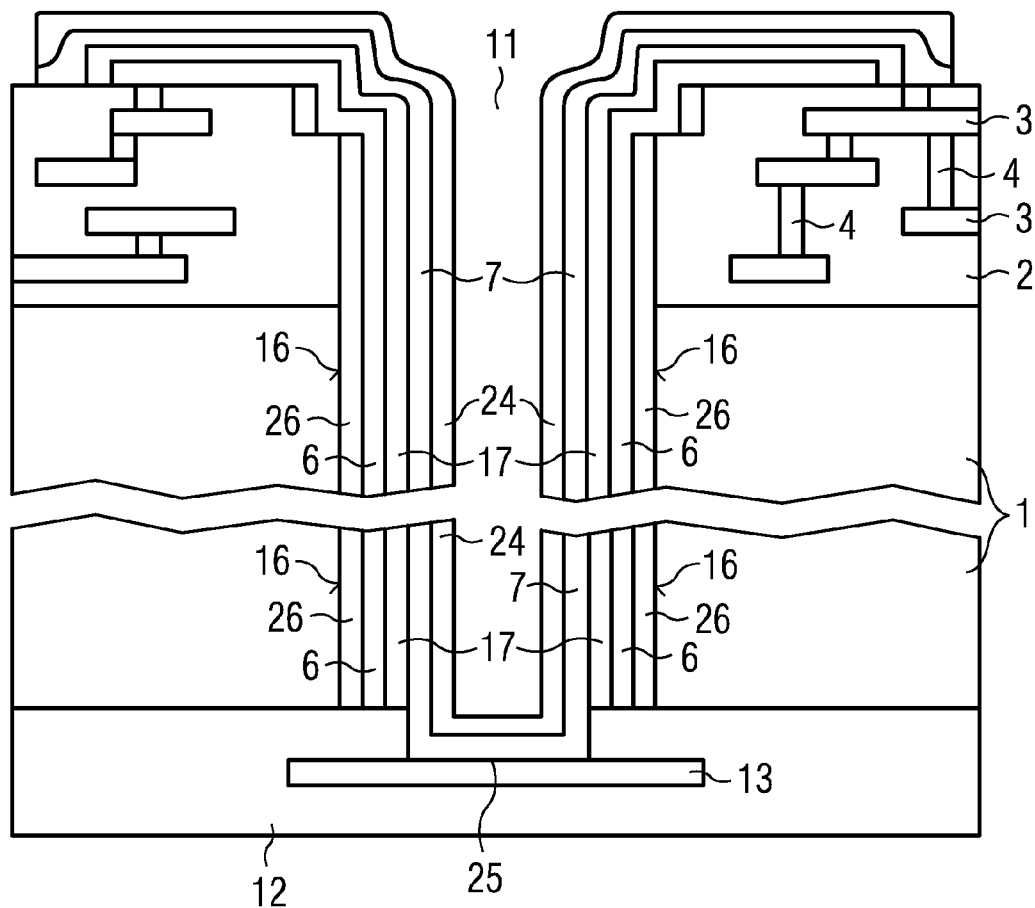
FIG. 14 shows a cross-section in accordance with FIG. 13 after the structuring of the other metal layer.

FIG. 14 shows a cross-section in accordance with FIG. 13 after the application of a further mask 24, which completely covers the metal layer 7 in the cutout 11. The mask 24 is used for the upper-side structuring of the metal layer 7.

Figure 15:
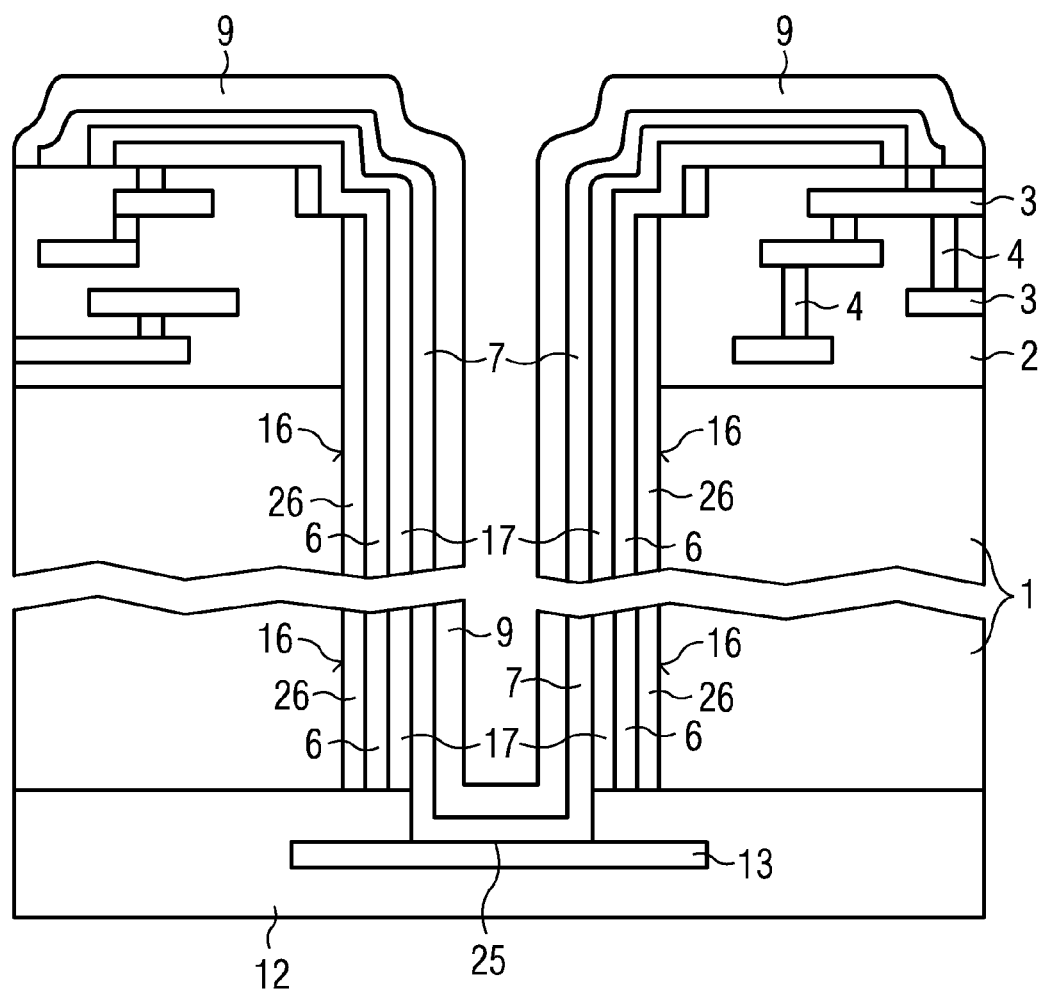
FIG. 15 shows a cross-section in accordance with FIG. 14 after the application of a passivation layer.

FIG. 15 shows a cross-section in accordance with FIG. 14 after the removal of the mask 24 and the application of a passivation layer 9. The remaining volume of the cutout 11 can remain vacant or can be filled with a dielectric material, for example.

Figure 16:
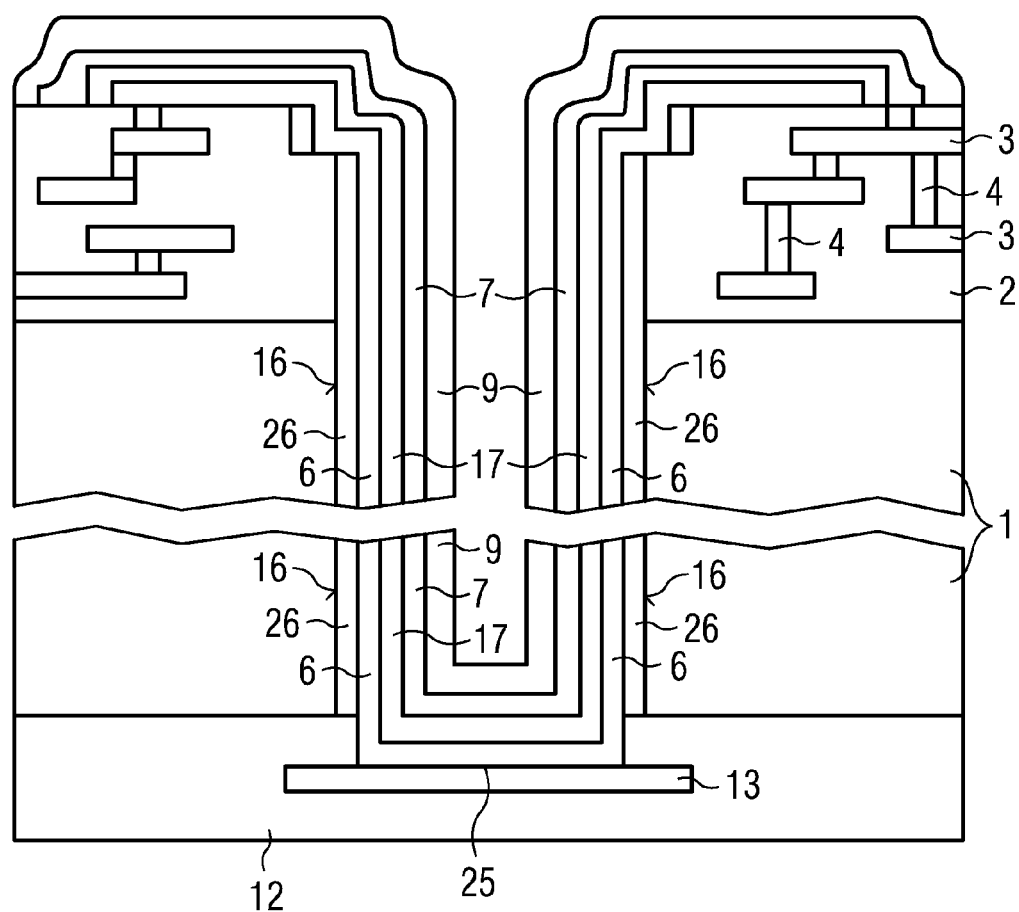
FIG. 16 shows a cross-section in accordance with FIG. 15 for another embodiment.
Figure 17:
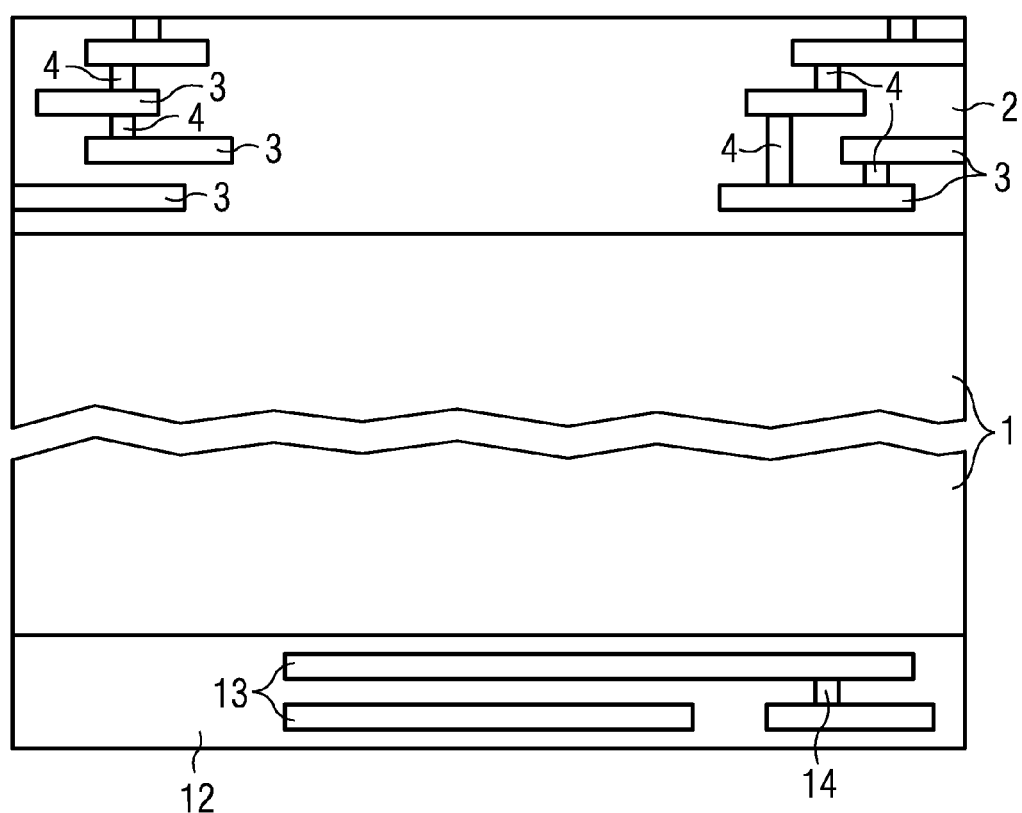
FIG. 17 shows a cross-section in accordance with FIG. 5 for another embodiment of the production method.

FIG. 16 shows an alternative embodiment in which the conductor layer 6 also forms the connection contact 25 of a through-connection on the back metal plane 13. If the metal layer 7 is also electrically insulated from the conductor layer 6 by the spacer 17 on the bottom of the cutout 11, the conductor layer 6 and the metal layer 7 can be used as a capacitor. The spacer 17 hereby forms the capacitor dielectric.

Instead of a metal layer, the conductor layer 6 can be produced by implantation of dopant in the side wall of the cutout 11. The remaining steps of the described method, in which the spacer layer 27 is applied and structured, the metal layer 7 is applied and optionally structured, and the connection contact 25 of the through-connection is produced, follow in the manner already described in conjunction with FIGS. 5 to 15.

In FIGS. 17 to 22 cross-sections of a further production method are shown. The cross-section of FIG. 17 corresponds to the cross-section of FIG. 5, wherein in contrast to the embodiment of FIG. 5, several back metal planes 13 are provided with corresponding vertical connections 14.

Figure 18:
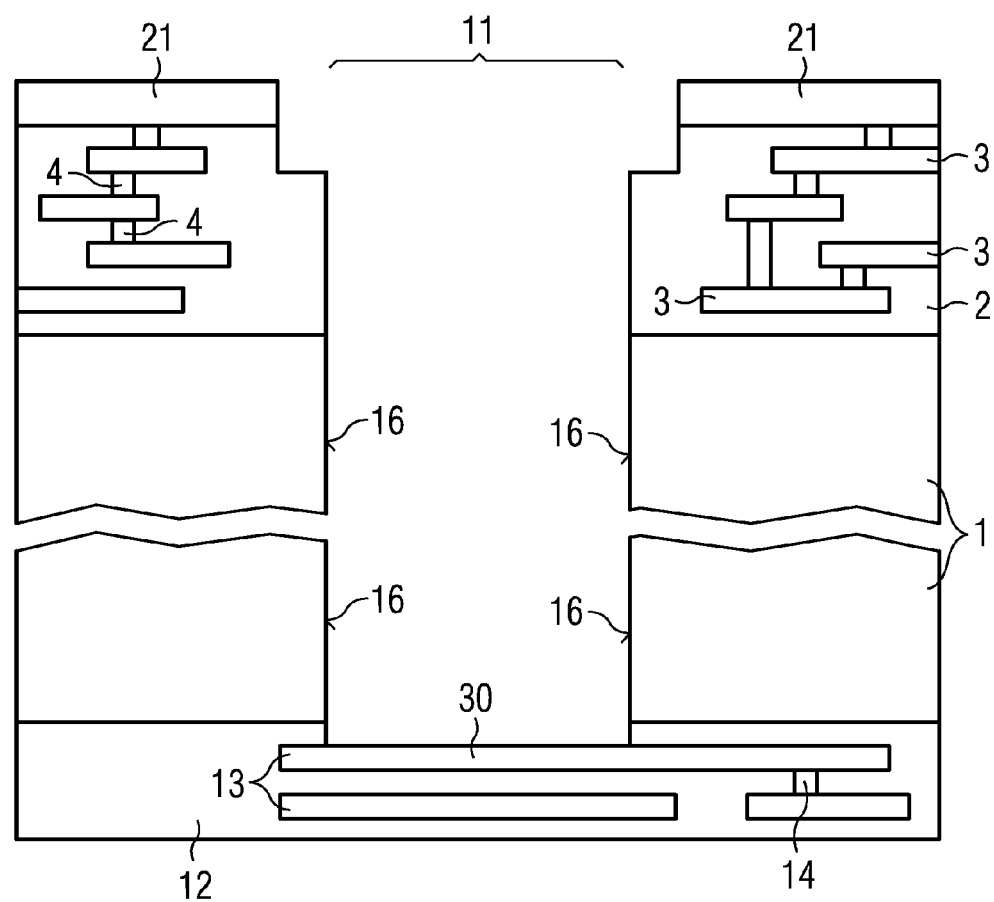
FIG. 18 shows a cross-section in accordance with FIG. 17 after the production of the cutout.

FIG. 18 shows a cross-section that corresponds to the cross-section of FIG. 7 and shows the intermediate product after the production of the cutout 11. In this example, a section of the uppermost back metal plane 30 through the cutout 11 is exposed.

Figure 19:
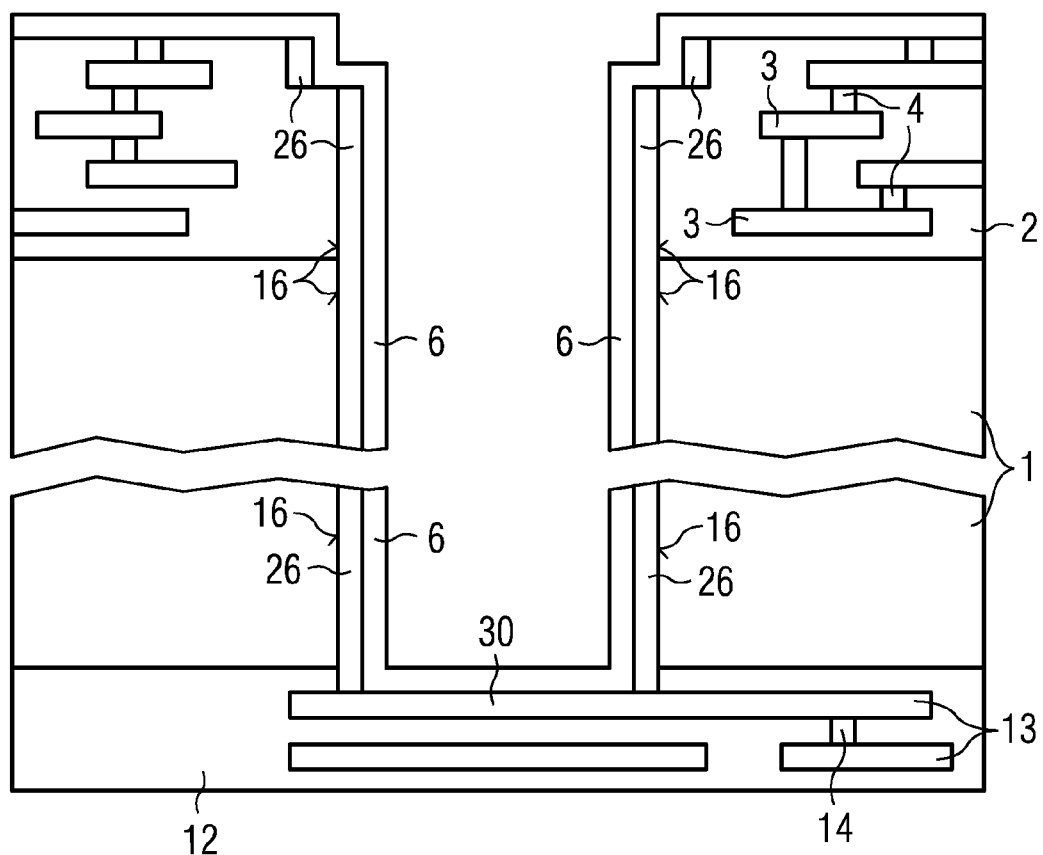
FIG. 19 shows a cross-section in accordance with FIG. 18 after the production of a spacer and a metal layer.

FIG. 19 shows a cross-section in accordance with FIG. 18 after the application and structuring of the insulation layer 26 and the whole-surface application of the conductor layer 6. Also in this embodiment the insulation layer 26 can be omitted. In this case the conductor layer 6 is directly applied on the surface 16 of the semiconductor body 1.

Figure 20:
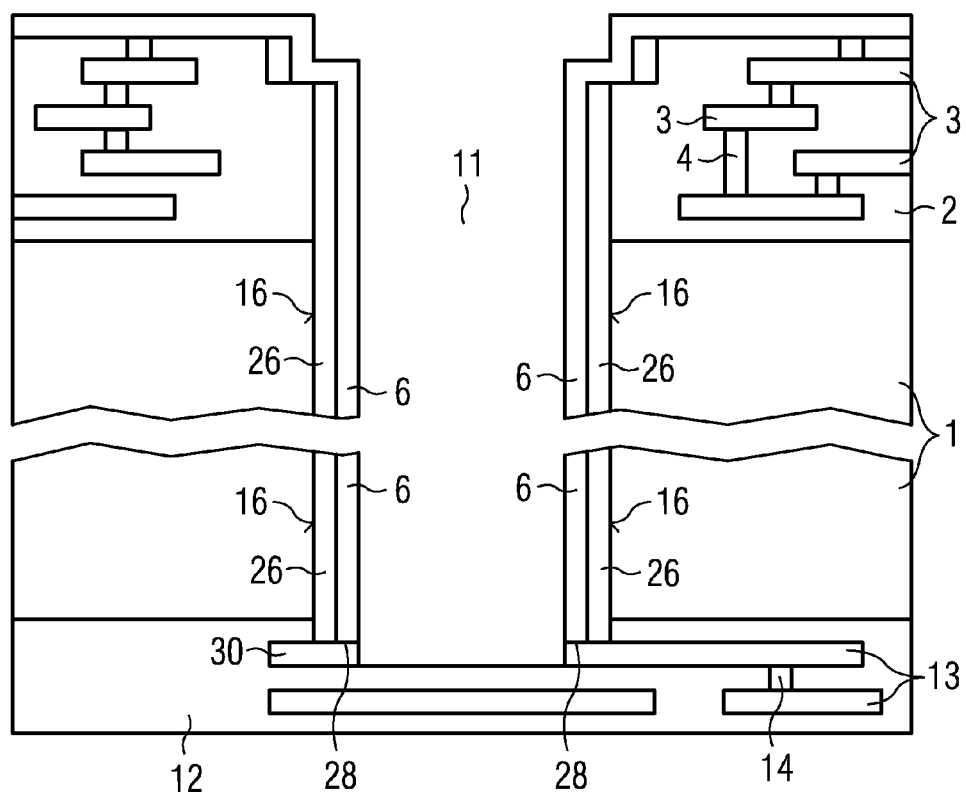
FIG. 20 shows a cross-section in accordance with FIG. 19 after the structuring of the metal layer.

FIG. 20 shows a cross-section in accordance with FIG. 19 after the removal of the conductor layer 6 on the bottom of the cutout 11, wherein the material of the uppermost back metal plane 30 is also removed in this region. The conductor layer 6 has a horizontal contact 28 to the uppermost back metal plane 30. In a modification of this embodiment, a corresponding section of the uppermost back metal plane 30 is removed before the conductor layer 6 is applied. The conductor layer 6 is in this case applied in such a way that it contacts the uppermost back metal plane 30 laterally.

Figure 21:
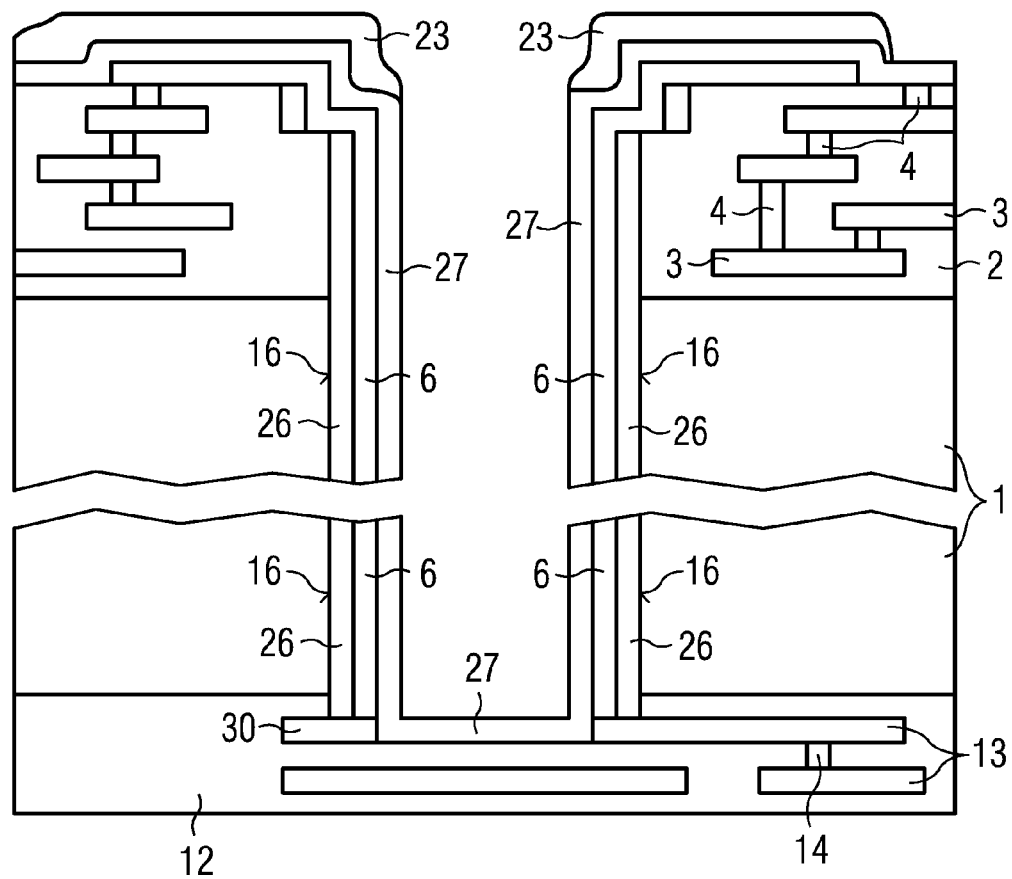
FIG. 21 shows a cross-section in accordance with FIG. 20 after the application of another spacer layer and a mask.

FIG. 21 shows a cross-section in accordance with FIG. 20 after the application of the spacer layer 27 and the further mask 23.

Figure 22:
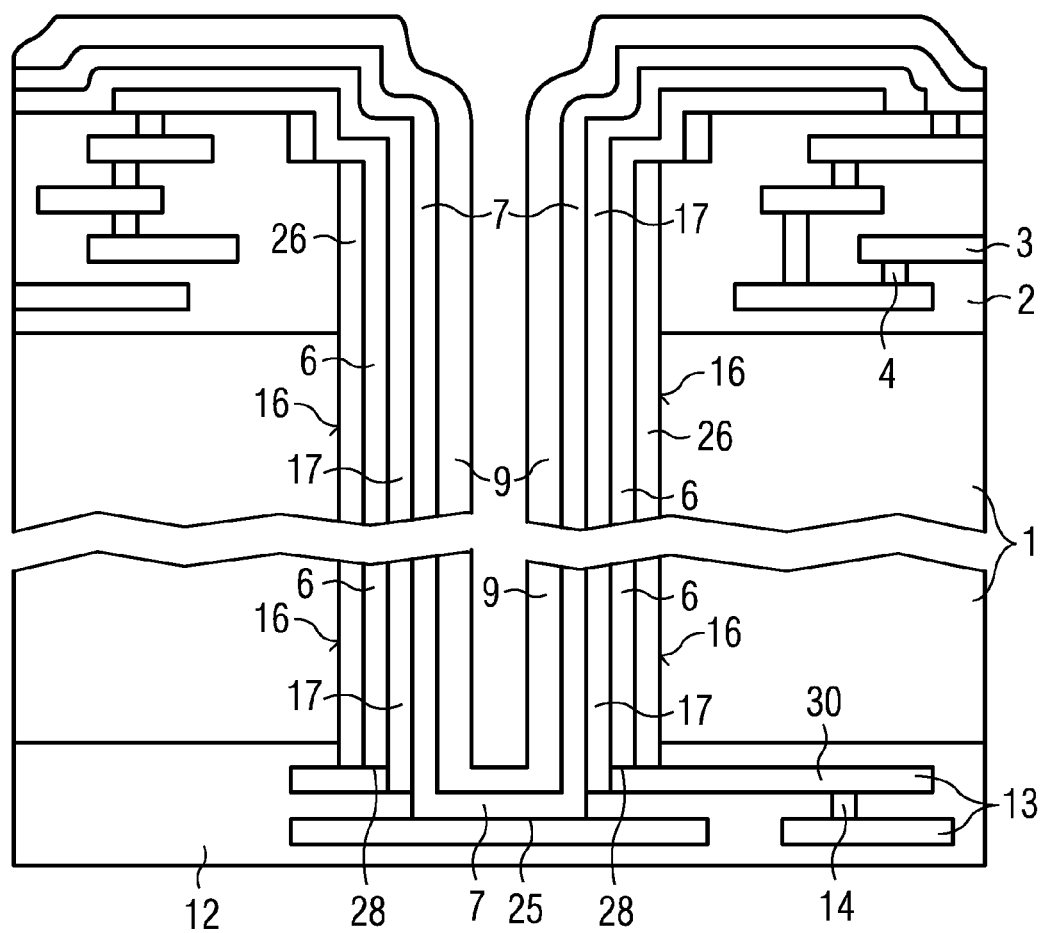
FIG. 22 shows a cross-section in accordance with FIG. 21 after the production of another spacer, another metal layer, and a passivation layer.

FIG. 22 shows the cross-section in accordance with FIG. 21 after the back etching of the spacer layer 27 using the mask 23, and the application of a metal layer 7 with which the connection contact 25 of the through-connection is produced on a back metal plane 13. In this embodiment the conductor layer 6 and the metal layer 7 are in contact with different back metal planes 13. The upper back metal plane 13 screens the other back metal planes 13 toward the semiconductor body 1. Optionally the conductor layer 6 can also be used as another through-connection in this embodiment. In order to apply an electrical potential provided for the screening function to the conductor layer 6, it is sufficient if the conductor layer 6 is connected to one of the metal planes 3, 13 only on one side of the semiconductor body 1.

Figure 23:
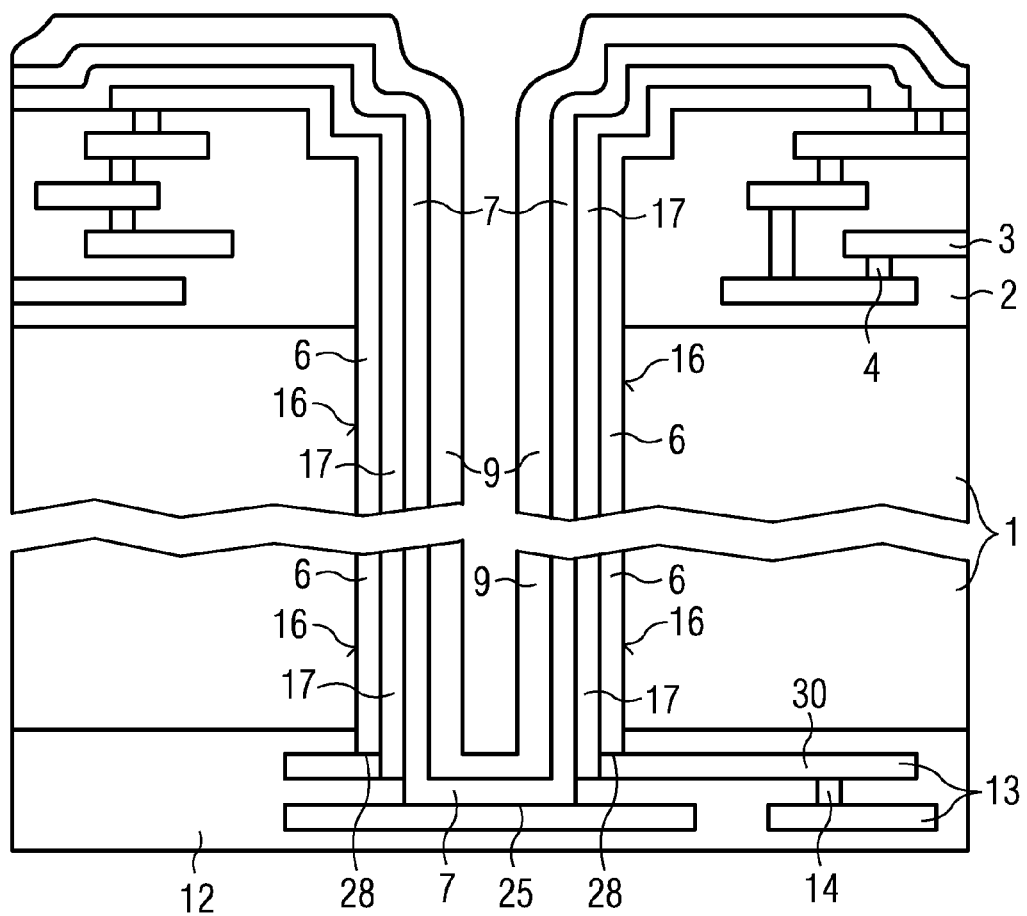
FIG. 23 shows a cross-section in accordance with FIG. 22 for a modification of this embodiment.

FIG. 23 shows a cross-section of the embodiment in accordance with FIG. 22 in a modification in which the insulation layer 26 was omitted and the conductor layer 6 is directly arranged on the surface 16 of the semiconductor body 1. The embodiments according to FIGS. 22 and 23 have the advantage that the conductor layer 6 and the uppermost back metal plane 30 can be etched together in one etching step, and no separate etching steps have to be carried out, between which another deposition takes place.

Figure 24:
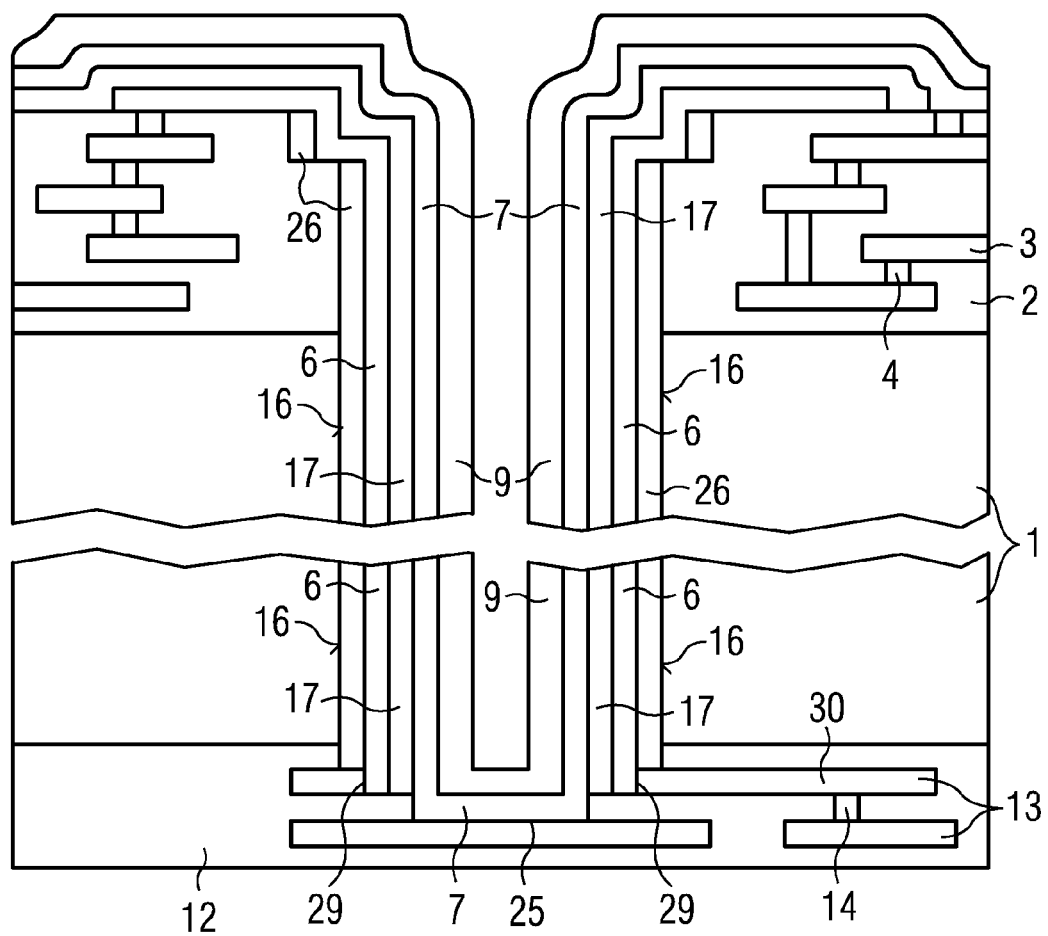
FIG. 24 shows a cross-section in accordance with FIG. 22 for another modification of this embodiment.

FIG. 24 shows a cross-section of the embodiment according to FIG. 22 in another modification, in which the conductor layer 6 was applied after a section of the uppermost back metal plane 30 was removed. The conductor layer 6 in this case forms a vertical contact 29 with the uppermost back metal plane 30.

Figure 25:
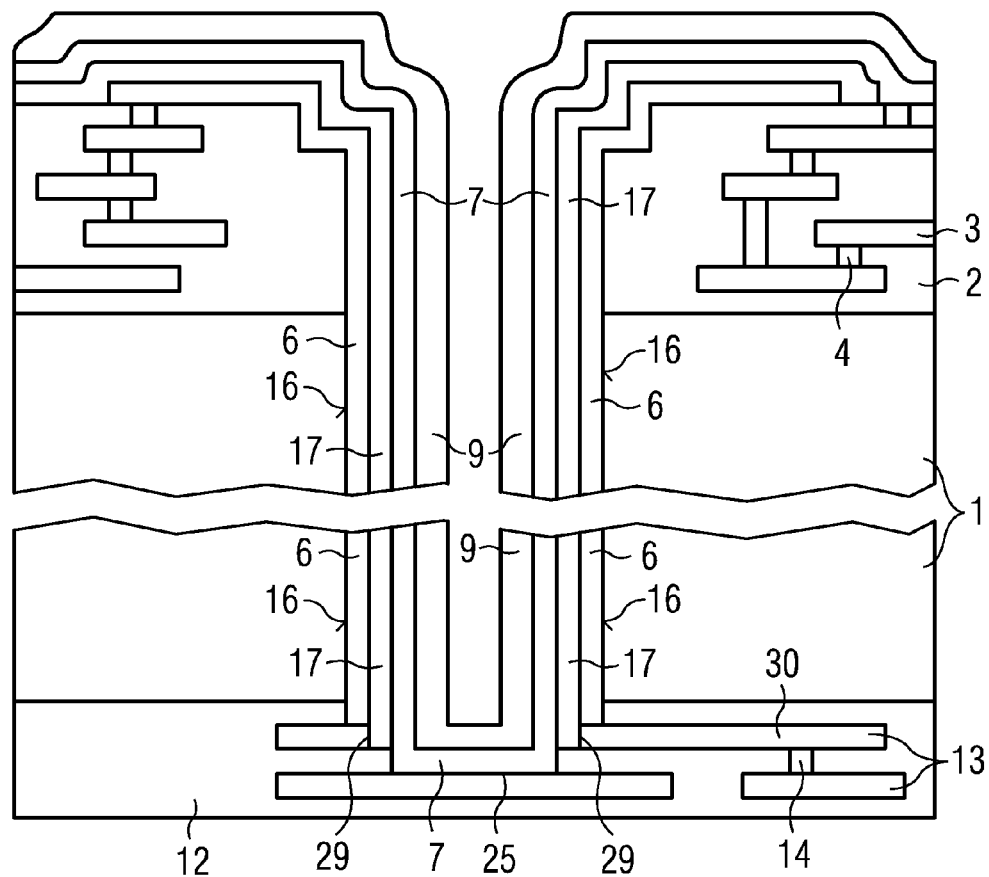
FIG. 25 shows a cross-section in accordance with FIG. 22 for another modification of this embodiment.

FIG. 25 shows a cross-section of the embodiment according to FIG. 24 in another modification, in which the insulation layer 26 was omitted and the conductor layer 6 is arranged directly on the surface 16 of the semiconductor body 1.

In embodiments the layer thickness of the conductor layer 6 can be smaller than the layer thickness of the uppermost back metal plane 30. If in such embodiments the horizontal portion of the conductor layer 6 is removed, the embodiments according to FIGS. 24 and 25, in comparison with the embodiments according to FIGS. 22 and 23, have the advantage that the vertical contact 29 has a larger surface than the horizontal contact 28.

Figure 26:
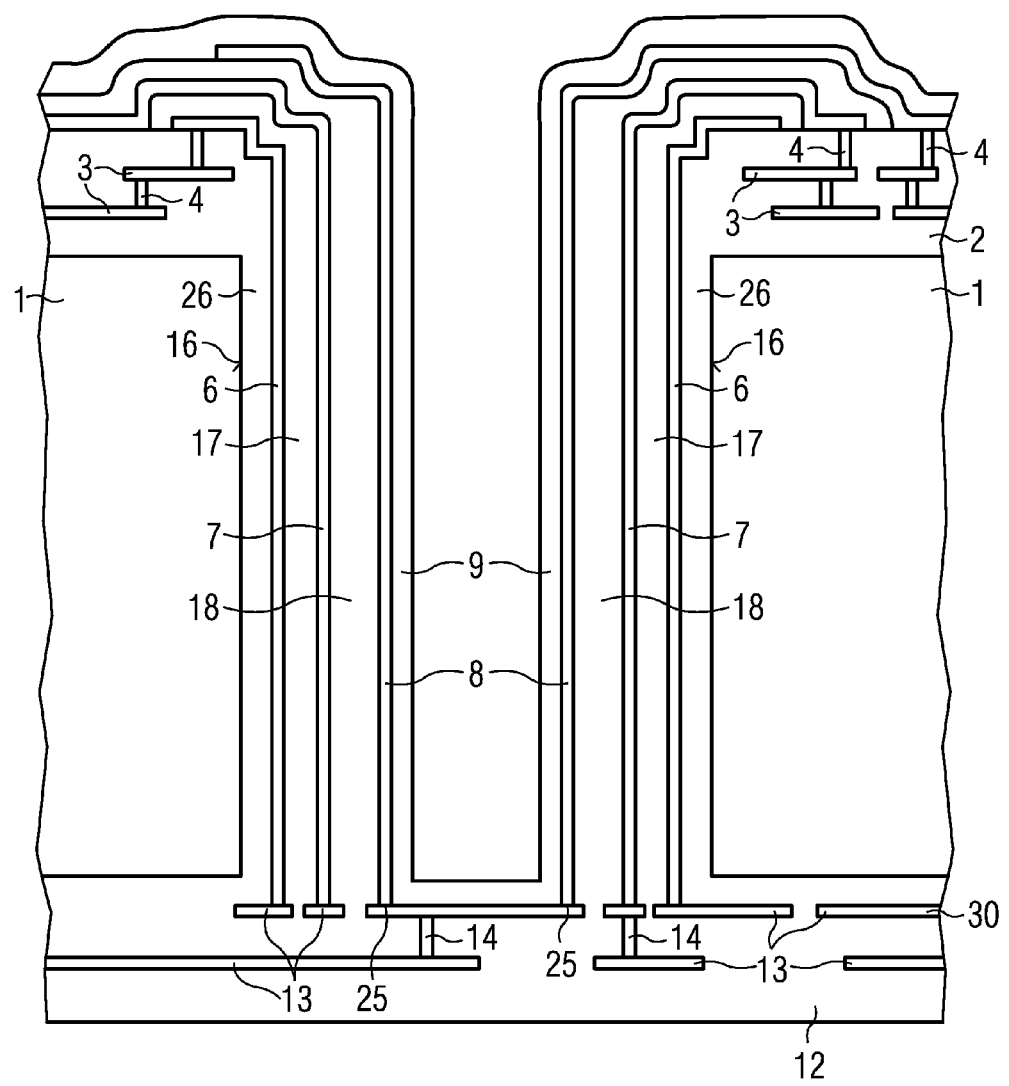
FIG. 26 shows a cross-section in accordance with FIG. 22 for an embodiment with three metal layers.

FIG. 26 shows a cross-section of a further embodiment, in which in addition to the conductor layer 6 and a metal layer 7, a further metal layer 8 is present. Between the metal layer 7 and the further metal layer 8, there is a further spacer 18 for the electrical insulation. The conductor layer 6, the metal layer 7 and the further metal layer 8 are electrically conductively connected to a structured portion of the metal planes 3 on the upper side via a vertical connection 4. Also on the back of the component, the conductor layer 6, the metal layer 7 and the further metal layer 8 are connected to structured portions of the back metal planes 13. These portions can be connected to other back metal planes 13 via back vertical connections 14, so that on the back a wiring can also be provided, which can be used as a redistribution in particular. In the embodiment shown in FIG. 23, both the conductor layer 6 and the metal layers 7, 8 are contacted on the same back metal plane 13. In order to apply an electrical potential provided for the screening function to the conductor layer 6, it is sufficient if the conductor layer 6 is connected to one of the metal planes 3, 13 only on one side of the semiconductor body 1.

FIG. 27 shows a cross-section in accordance with FIG. 26 for a further embodiment, in which a further metal layer 8 is present as well. In this embodiment, the conductor layer 6, the metal layer 7 and the further metal layer 8 are contacted on different back metal planes 13. In this embodiment as well, in order to apply an electrical potential provided for the screening function to the conductor layer 6, it is sufficient if the conductor layer 6 is connected to one of the metal planes 3, 13 only on one side of the semiconductor body 1. A comparison of FIGS. 26 and 27 shows that there is a plurality of possibilities to form through-connections, screenings, capacitors, or the like, insulated from one another, using the metal layers 7, 8 within the same cutout 11 of the semiconductor body 1.

A comparison of the embodiments according to FIGS. 26 and 27 with the embodiments according to FIGS. 2, 3, and 4 also shows that the front and back wirings are exchangeable and that the device structures shown can be produced by use of the described production method proceeding from any of the sides of the semiconductor body 1. If a three-dimensional integration of the semiconductor component is provided, the back wiring, which is formed by metal planes 13 and vertical connections 14 in a back dielectric 12, can be, for example, a component of the next chip within a stack of chips. In this case, the back wiring structure can, for example, be used as a connection layer in a wafer bonding process.

With the described method, it is possible to produce vertical conductors leading through the substrate, electrically insulated from one another, for different functions, such as through-connections, coaxial cables, resistor, capacitor, or the like. Connections of the conductors to wirings can be provided on one or two sides.

REFERENCE SYMBOL LIST

1 Semiconductor body
1a Upper side
1b Underside
2 Dielectric
3 Metal plane
4 Vertical connection
5 Connection contact surface
6 Conductor layer
6a Barrier layer
7 Metal layer
8 Further metal layer
9 Passivation layer
10 Epitaxial layer
11 Cutout
12 Dielectric
13 Metal plane
14 Vertical connection
15 Connection contact surface
16 Surface
17 Spacer
18 Further spacer
19 Step
20 Doped section
21 Mask
22 Mask
23 Mask
24 Mask
25 Connection contact
26 Insulation layer
27 Spacer layer
28 Horizontal contact
29 Vertical contact
30 Uppermost back metal plane

The invention claimed is:
1. A method for the production of a semiconductor component, wherein
a semiconductor body is provided on at least one upper side or underside with metal planes in a dielectric;

a cutout is produced in the dielectric and in the semiconductor body, so that the cutout penetrates the semiconductor body, and the semiconductor body has a surface in the cutout;
a conductor layer is produced at this surface in direct connection with the semiconductor body;
the conductor layer is electrically conductively connected to one of the metal planes; and
the conductor layer is produced by implanting a dopant in the semiconductor body or by depositing a thin doped layer.

2. A method for the production of a semiconductor component, wherein
a semiconductor body is provided on at least one upper side or underside with metal planes in a dielectric;
a cutout is produced in the dielectric and in the semiconductor body, so that the cutout penetrates the semiconductor body, and the semiconductor body has a surface in the cutout;
a conductor layer is produced at this surface in direct connection with the semiconductor body;
the conductor layer is electrically conductively connected to one of the metal planes; and
the conductor layer is produced by applying a barrier layer on the surface of the semiconductor body and applying a metal on the barrier layer.

3. The method according to claim 2, wherein the semiconductor body is silicon and a silicide is formed with the conductor layer.

4. A method for the production of a semiconductor component, wherein
a semiconductor body is provided on at least one upper side or underside with metal planes in a dielectric;
a cutout is produced in the dielectric and in the semiconductor body, so that the cutout penetrates the semiconductor body, and the semiconductor body has a surface in the cutout;
a conductor layer is produced at this surface in direct connection with the semiconductor body;
the conductor layer is electrically conductively connected to one of the metal planes; and
the conductor layer in the cutout is covered with a spacer made of dielectric material, and a metal layer is applied and structured, so that the metal layer is present within the cutout and electrically insulated from the conductor layer by the spacer and is outside the cutout electrically conductively connected to at least one of the metal planes.

5. A method for the production of a semiconductor component, wherein
a semiconductor body is provided with a dielectric at an upper side and at an underside opposite the upper side and with metal planes located at least on one side of the semiconductor body in the dielectric;
a cutout is formed in the dielectric present at the upper side and in the semiconductor body, so that the cutout penetrates the semiconductor body and is limited by the dielectric present at the underside;
a conductor layer is applied and structured in such a manner that it screens the semiconductor body toward the cutout and is electrically conductively connected to at least one of the metal planes;
the conductor layer in the cutout is covered with a spacer formed from dielectric material; and
a metal layer is applied and structured, so that the metal layer is present within the cutout and electrically insulated from the conductor layer by the spacer, and is outside the cutout electrically conductively connected to at least one of the metal planes.

6. The method according to claim 5, wherein
at least one of the metal planes is provided in the dielectric arranged at the underside of the semiconductor body;
with the production of the spacer, a region of said metal plane is exposed; and
the metal layer is placed and structured in such a way that the metal layer forms a connection contact on the exposed region.

7. The method according to one of claims 1 to 6, wherein
after the production of the cutout and before the production of the conductor layer, one of the metal planes is removed in the region of the cutout; and
the conductor layer is arranged in such a way that it forms a contact to said metal plane vertically with respect to said metal plane.

8. The method according to one of claims 4 to 6, wherein
the metal layer in the cutout is covered with a further spacer formed from dielectric material; and
a further metal layer is arranged and structured, so that the further metal layer is present within the cutout and electrically insulated from the metal layer by the further spacer and is outside the cutout electrically conductively connected to at least one of the metal planes.

9. The method according to claim 8, wherein the conductor layer, the metal layer and the further metal layer are contacted with different metal planes on both sides of the semiconductor body.

10. The method according to claim 8, wherein the conductor layer, the metal layer and the further metal layer are contacted with the same metal planes at least on one side of the semiconductor body.

11. A method for the production of a semiconductor component, wherein
a semiconductor body is provided on at least one upper side or underside with metal planes in a dielectric;
a cutout is produced in the dielectric and in the semiconductor body, so that the cutout penetrates the semiconductor body, and the semiconductor body has a surface in the cutout;
a conductor layer is produced at this surface in direct connection with the semiconductor body;
the conductor layer is electrically conductively connected to one of the metal planes;
after the production of the cutout and before the production of the conductor layer, one of the metal planes is removed in the region of the cutout; and
the conductor layer is arranged in such a way that it forms a contact to said metal plane vertically with respect to said metal plane.

* * * * *